(12) United States Patent
Okita et al.

(10) Patent No.: US 9,570,272 B2
(45) Date of Patent: Feb. 14, 2017

(54) PLASMA PROCESSING APPARATUS AND PLASMA PROCESSING METHOD

(71) Applicant: Panasonic Intellectual Property Management Co., Ltd., Osaka (JP)

(72) Inventors: Shogo Okita, Hyogo (JP); Atsushi Harikai, Osaka (JP); Noriyuki Matsubara, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/000,374

(22) Filed: Jan. 19, 2016

(65) Prior Publication Data
US 2016/0293381 A1 Oct. 6, 2016

(30) Foreign Application Priority Data

Mar. 31, 2015 (JP) .................. 2015-073376
Mar. 31, 2015 (JP) .................. 2015-073513

(51) Int. Cl.
*H01J 37/32* (2006.01)
*H01L 21/683* (2006.01)
*H01L 21/687* (2006.01)

(52) U.S. Cl.
CPC ........ *H01J 37/32009* (2013.01); *H01J 37/321* (2013.01); *H01J 37/3244* (2013.01); *H01J 37/32715* (2013.01); *H01J 37/32733* (2013.01); *H01L 21/6833* (2013.01); *H01L 21/68742* (2013.01); *H01J 2237/334* (2013.01)

(58) Field of Classification Search
None
See application file for complete search history.

(56) References Cited

U.S. PATENT DOCUMENTS

| 5,325,261 | A | * | 6/1994 | Horwitz | ................ | H02N 13/00 |
| | | | | | | 361/230 |
| 5,612,850 | A | * | 3/1997 | Birang | ................ | H01L 21/6831 |
| | | | | | | 361/234 |
| 6,975,497 | B2 | * | 12/2005 | Nagao | ................ | G03F 7/70691 |
| | | | | | | 279/128 |
| 9,236,305 | B2 | * | 1/2016 | Lei | ........................ | H01L 21/78 |
| 2002/0002950 | A1 | * | 1/2002 | Tsuchihashi | ........ | C23C 16/4586 |
| | | | | | | 118/724 |

(Continued)

FOREIGN PATENT DOCUMENTS

JP 2009-094436 A 4/2009

*Primary Examiner* — Allan Olsen
(74) *Attorney, Agent, or Firm* — Pearne & Gordon LLP

(57) ABSTRACT

A plasma processing apparatus includes: a reaction chamber; a stage which is disposed inside the reaction chamber and on which a conveyance carrier is mountable; an electrostatic chuck mechanism including an electrode portion that is disposed inside the stage; a support portion which supports the conveyance carrier between a stage-mounted position on the stage and a transfer position that is distant from the stage upward; and an elevation mechanism which elevates and lowers the support portion relative to the stage. In a case in which the conveyance carrier is mounted on the stage by lowering the support portion, the electrostatic chuck mechanism starts applying a voltage to the electrode portion before contact of an outer circumferential portion of a holding sheet which holds the conveyance carrier to the stage.

5 Claims, 16 Drawing Sheets

(56) References Cited

U.S. PATENT DOCUMENTS

| | | | |
|---|---|---|---|
| 2002/0006680 A1* | 1/2002 | Katala | H01L 21/67103 |
| | | | 438/22 |
| 2009/0097185 A1* | 4/2009 | Shannon | H01J 37/32091 |
| | | | 361/234 |
| 2010/0216313 A1 | 8/2010 | Iwai | |
| 2011/0151669 A1* | 6/2011 | Lin | H01L 21/31116 |
| | | | 438/689 |
| 2014/0071580 A1* | 3/2014 | Higginson | B81C 99/002 |
| | | | 361/234 |
| 2015/0059980 A1* | 3/2015 | Okita | H01J 37/32477 |
| | | | 156/345.51 |
| 2015/0340208 A1* | 11/2015 | Harikai | H01J 37/32715 |
| | | | 216/67 |
| 2016/0276199 A1* | 9/2016 | Iida | H01L 21/6833 |

* cited by examiner

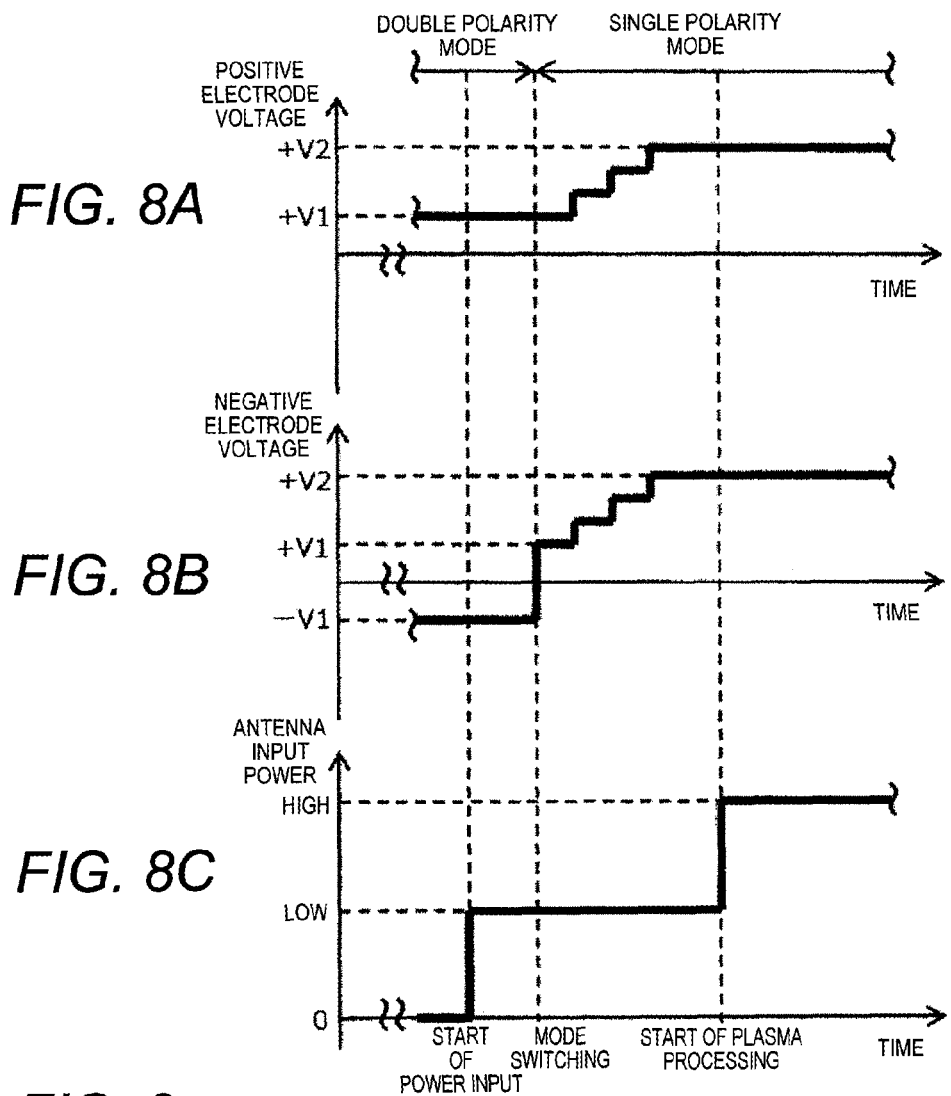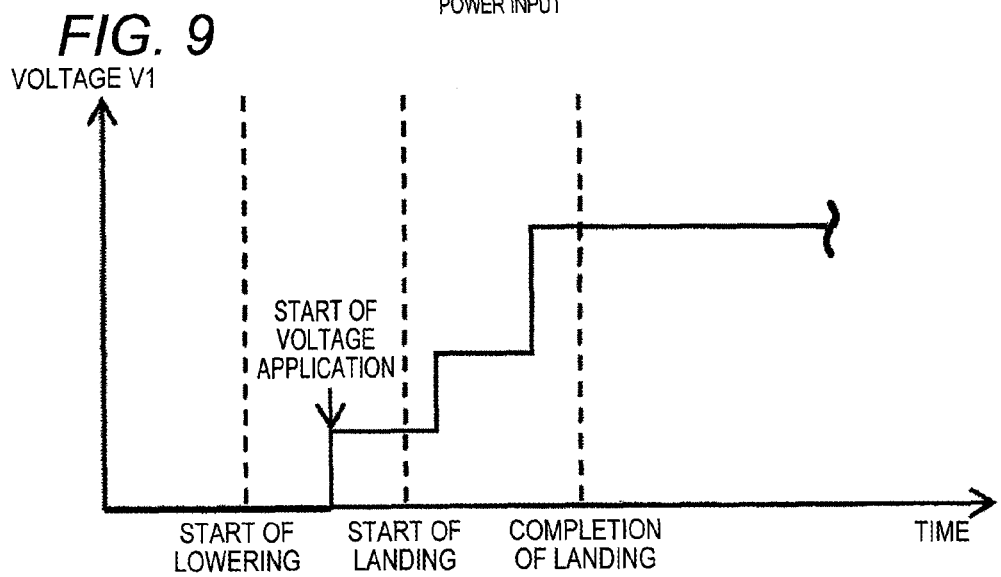

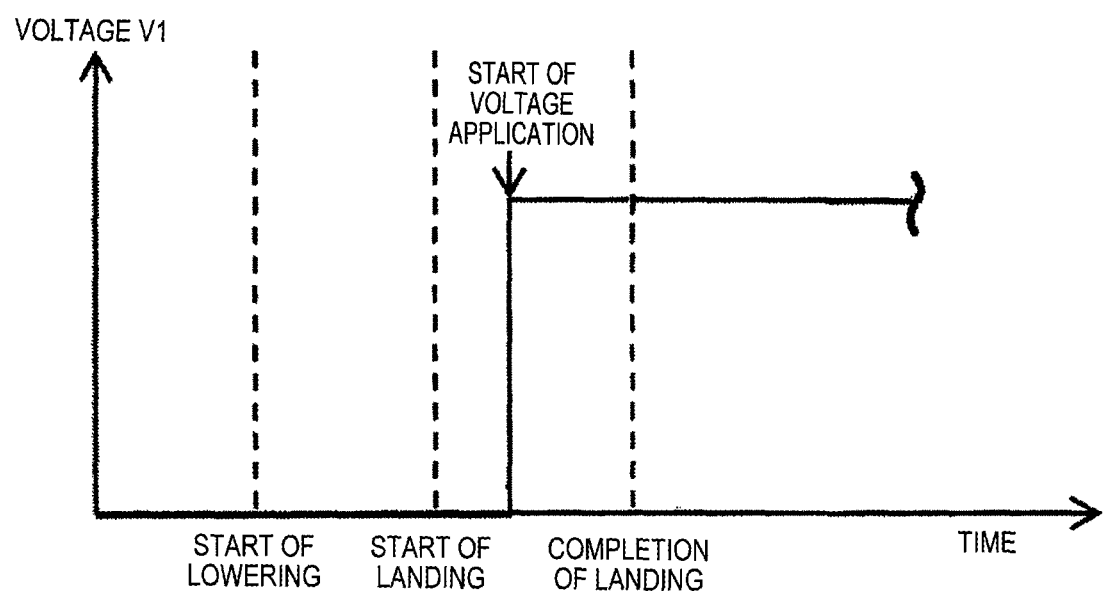

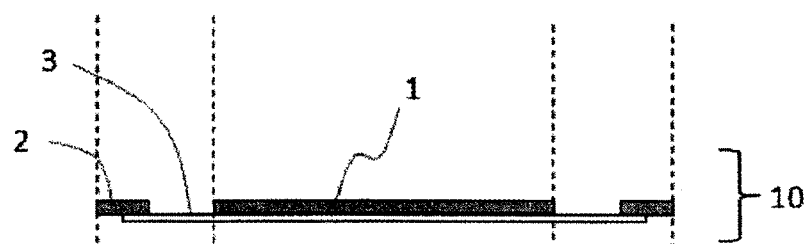
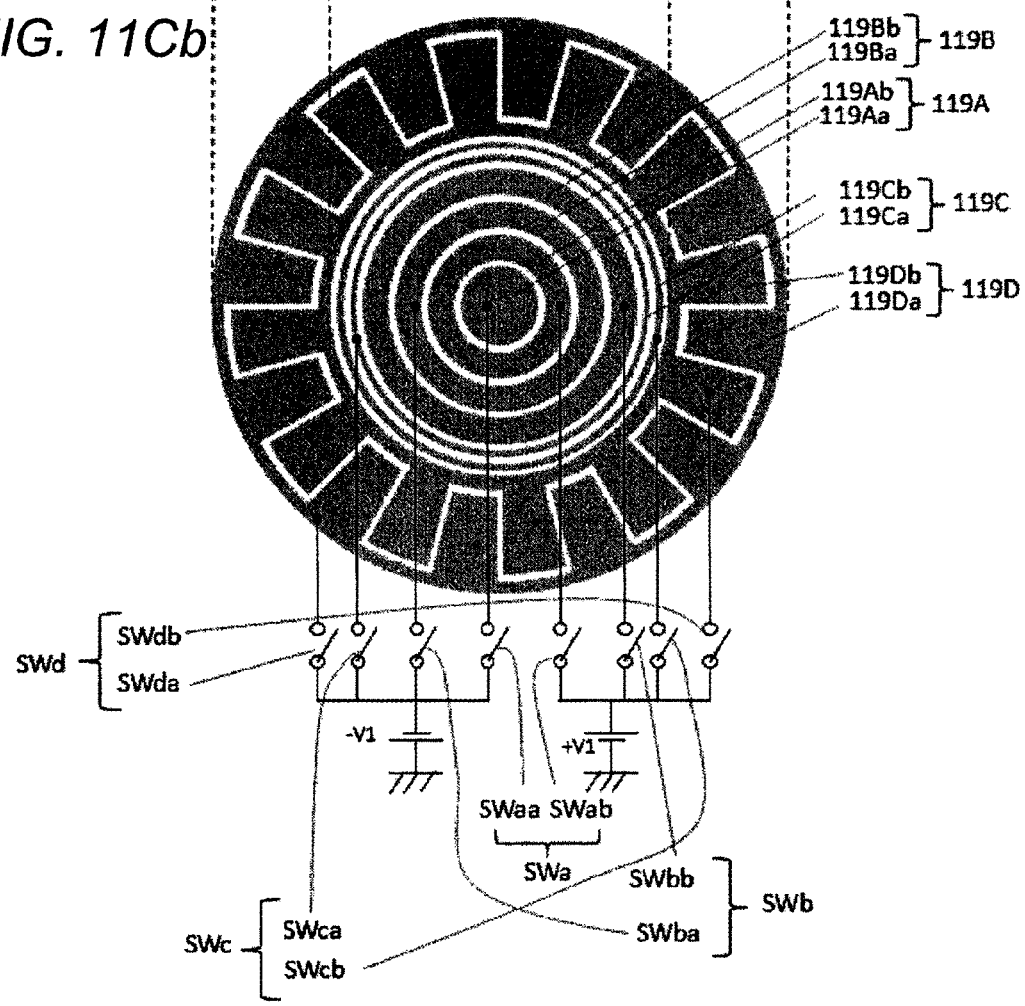

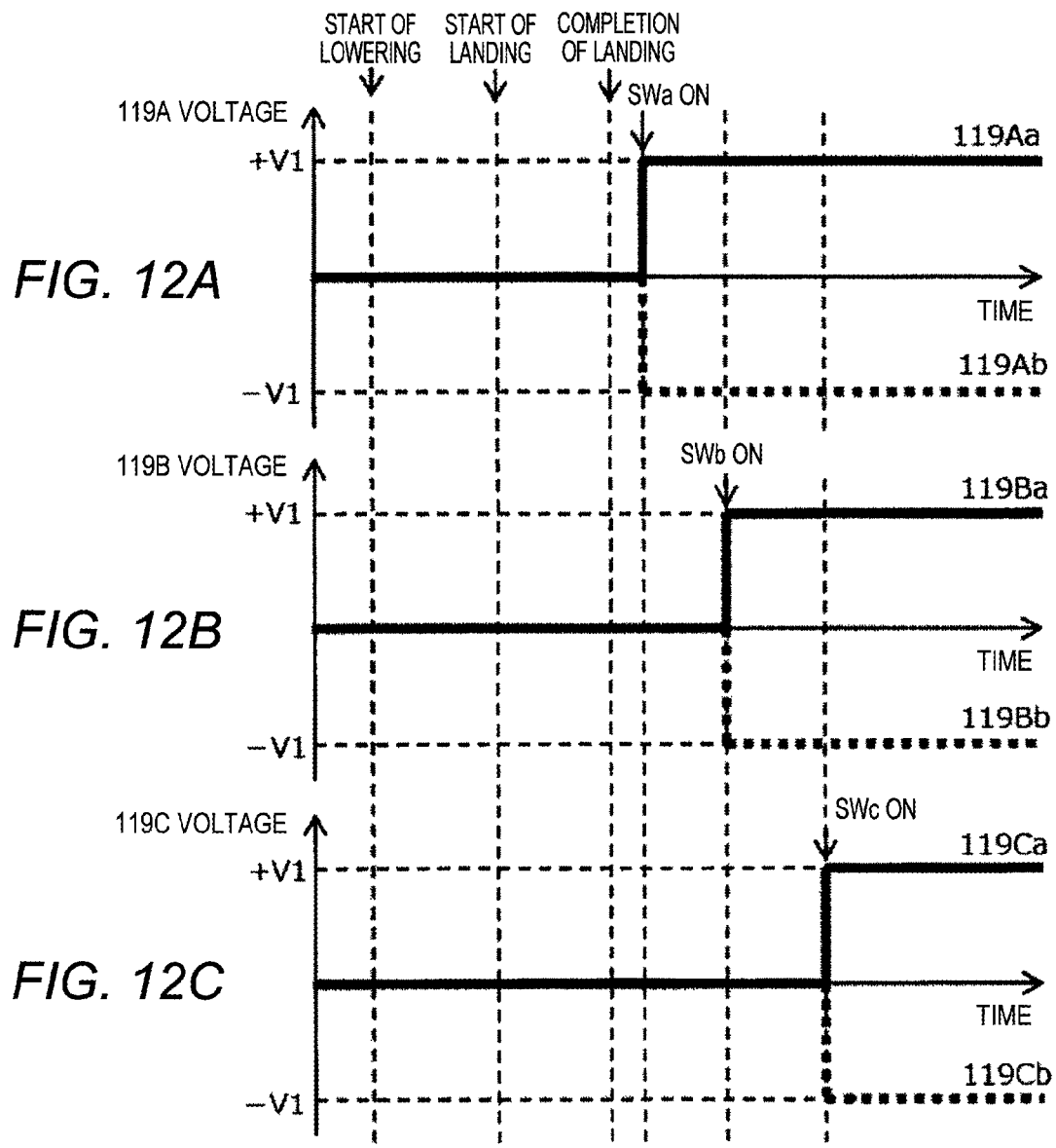

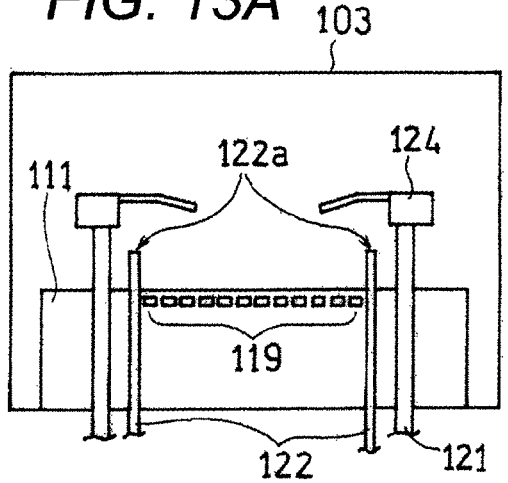
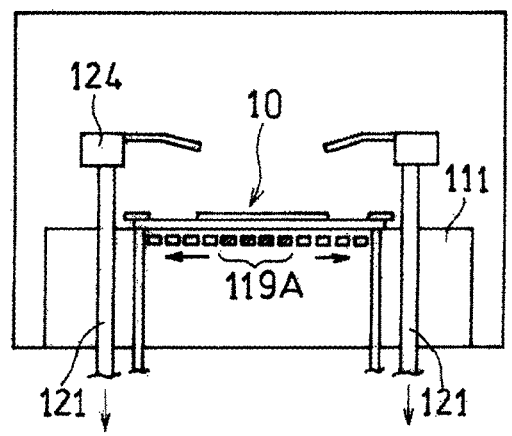
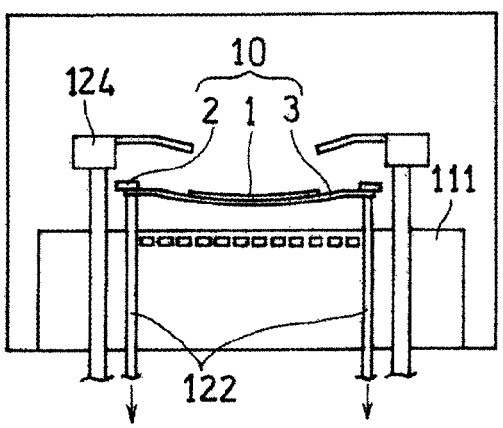
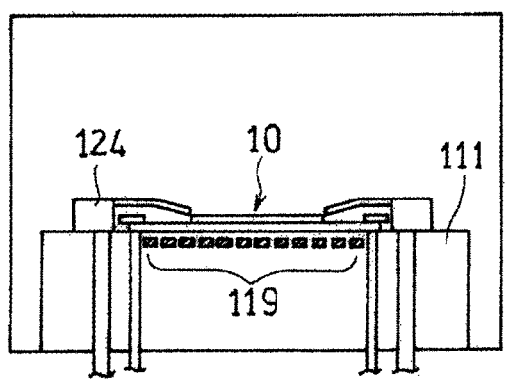
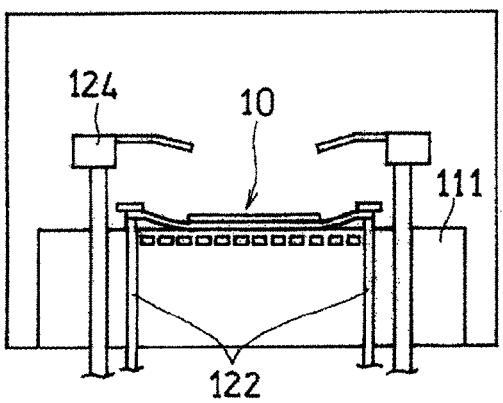

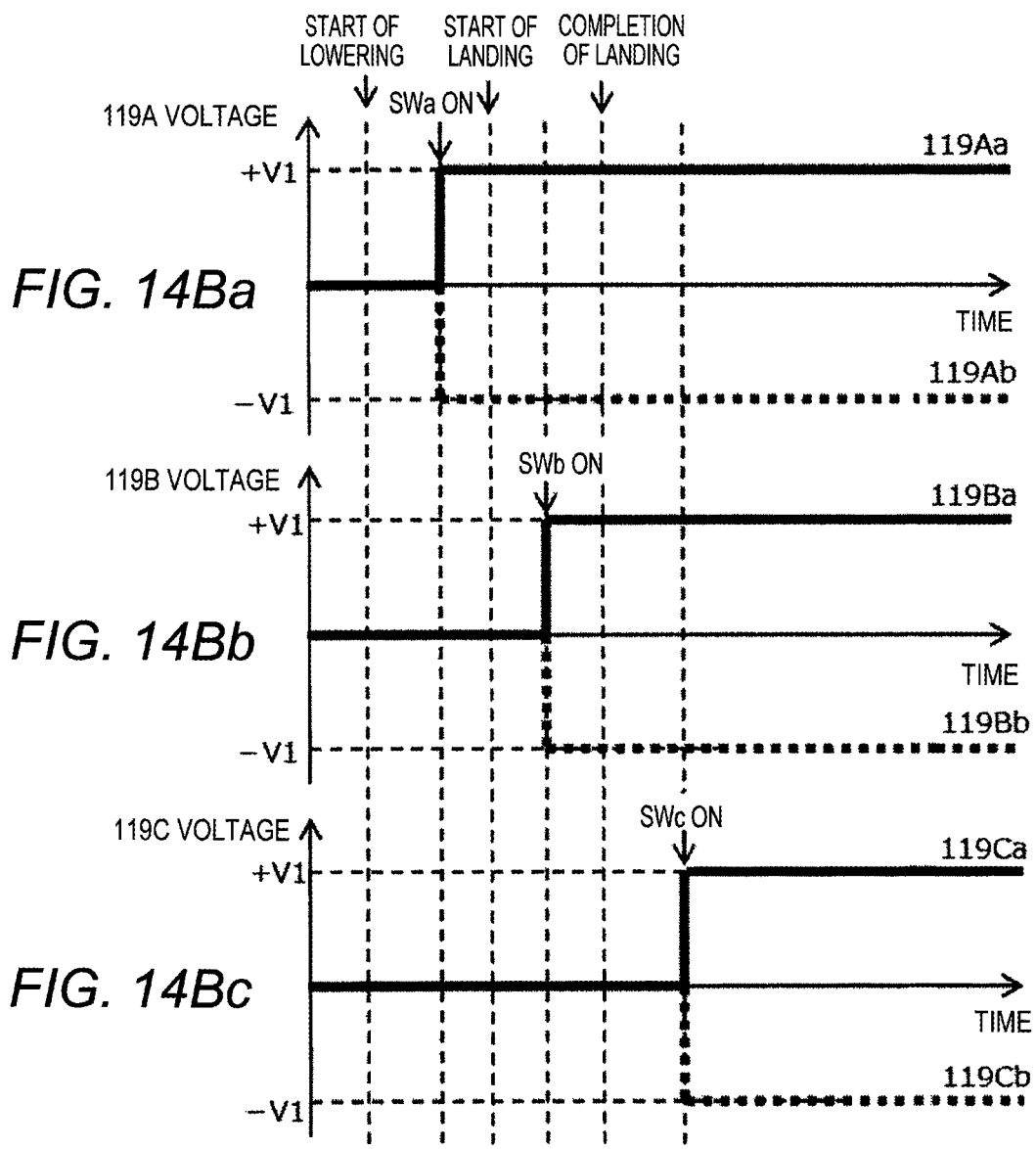

PLASMA PROCESSING APPARATUS AND PLASMA PROCESSING METHOD

CROSS-REFERENCE TO RELATED APPLICATION(S)

This application is based on and claims priority from Japanese Patent Application No. 2015-073376 filed on Mar. 31, 2015 and Japanese Patent Application No. 2015-073513 filed on Mar. 31, 2015, the entire contents of which are incorporated herein by reference.

BACKGROUND

1. Field of the Invention

One or more embodiments of the present invention relate to a plasma processing apparatus and a plasma processing method. More particularly, one or more embodiments of the invention relate to a plasma processing apparatus and a plasma processing method for processing a substrate that is held by a conveyance carrier.

2. Description of Related Art

Among various methods for dicing a substrate is plasma dicing which performs plasma etching on a substrate on which a resist mask is formed and thereby divides it into individual chips. JP-A-2009-94436 discloses performing plasma processing on a substrate that is mounted on a plasma processing stage (hereinafter referred to simply as a stage) in such a manner as to be bonded to a conveyance carrier having a frame and a holding sheet that covers an opening of the frame, to improve substrate handling performance during conveyance etc.

SUMMARY

Where plasma processing is performed on a substrate that is mounted being held by a conveyance carrier, usually the conveyance carrier is absorbed on the stage by means of an electrostatic chuck mechanism called an electrostatic chuck. The electrostatic chuck mechanism applies a voltage to an electrostatic chuck electrode (hereinafter referred to as an ESC electrode) disposed inside the stage and causes the conveyance carrier to be absorbed on the stage by Coulomb force or Johnsen-Rahbek force that acts between the ESC electrode and the conveyance carrier. The stage is being cooled. By performing plasma processing in a state that the conveyance carrier is absorbed on the stage being cooled, the conveyance carrier being subjected to plasma processing can be cooled effectively.

In recent years, with the miniaturization and thickness reduction of electronic devices, IC chips etc. that are incorporated in electronic devices have been reduced in thickness. And substrates on which IC chips etc. as dicing targets are to be formed have been reduced in thickness accordingly and hence are prone to warp.

Holding sheets for holding a substrate are also thin and hence prone to warp. Therefore, there may occur an event that a conveyance carrier that holds a substrate is mounted on a stage with the holding sheet wrinkled. The holding sheet is not unwrinkled even if the conveyance carrier is absorbed on the stage by means of an electrostatic chuck mechanism. If plasma processing is performed in a state that the holding sheet is kept wrinkled, abnormal discharge or temperature increase may occur at wrinkles to disable normal plasma processing.

An aspect of the invention includes a plasma processing apparatus for performing plasma processing on a substrate that is held by a conveyance carrier including a holding sheet that holds the substrate and a frame that is attached to an outer circumferential portion of the holding sheet. The plasma processing apparatus includes: a reaction chamber; a stage which is disposed inside the reaction chamber and on which the conveyance carrier is mountable; an electrostatic chuck mechanism including an electrode portion that is disposed inside the stage; a support portion which supports the conveyance carrier between a stage-mounted position on the stage and a transfer position that is distant from the stage upward; and an elevation mechanism which elevates and lowers the support portion relative to the stage. In a case in which the conveyance carrier is mounted on the stage by lowering the support portion, the electrostatic chuck mechanism starts applying a voltage to the electrode portion before contact of the outer circumferential portion of the holding sheet to the stage.

Another aspect of the invention includes a plasma processing method for performing plasma processing on a substrate that is held by a conveyance carrier that is mounted on a stage of the plasma processing apparatus, the conveyance carrier including a holding sheet that holds the substrate and a frame that is attached to an outer circumferential portion of the holding sheet. The plasma processing method includes: causing a support portion, which is capable of being elevated and lowered relative to the stage, to support the conveyance carrier at a transfer position that is distant from the stage upward; mounting the conveyance carrier to a stage-mounted position on the stage by lowering the support portion; and applying a voltage to an electrode portion, disposed inside the stage, of an electrostatic chuck mechanism before contact of the outer circumferential portion of the holding sheet to the stage.

Yet another aspect of the invention includes a plasma processing apparatus for performing plasma processing on a substrate that is held by a conveyance carrier including a holding sheet that holds the substrate and a frame that is attached to an outer circumferential portion of the holding sheet. The plasma processing apparatus includes: a reaction chamber; a stage which is disposed inside the reaction chamber and on which the conveyance carrier is mountable; an electrostatic chuck mechanism including an electrode portion that is disposed inside the stage and includes a plurality of ring-shaped electrodes arranged concentrically; a support portion which supports the conveyance carrier between a stage-mounted position on the stage and a transfer position that is distant from the stage upward; and an elevation mechanism which elevates and lowers the support portion relative to the stage. In a case in which the conveyance carrier is mounted on the stage by lowering the support portion, the electrostatic chuck mechanism applies voltages to the plurality of ring-shaped electrodes in order from a central side of the ring-shaped electrode toward an outer circumference side.

Yet another aspect of the invention includes a plasma processing method for performing plasma processing on a substrate that is held by a conveyance carrier that is mounted on a stage of the plasma processing apparatus, the conveyance carrier including a holding sheet that holds the substrate and a frame that is attached to an outer circumferential portion of the holding sheet. The plasma processing method includes: causing a support portion, which is capable of being elevated and lowered relative to the stage, to support the conveyance carrier at a transfer position that is distant from the stage upward; mounting the conveyance carrier to a stage-mounted position on the stage by lowering the support portion; and applying voltages to an electrode portion, disposed inside the stage, of an electrostatic chuck mechanism. The electrode portion includes a plurality of ring-shaped electrodes arranged concentrically, and voltages are applied to the plural ring-shaped electrodes in order from a central side of the ring-shaped electrode toward an outer circumference side.

Owing to one or more embodiments of the invention, it is possible to increase the yield of products of plasma processing that is performed on a substrate that is held by a conveyance carrier.

BRIEF DESCRIPTION OF THE DRAWINGS

FIGS. 8A to 8C show an operation of the plasma processing apparatus according to the first embodiment; FIGS. 8A and 8B are conceptual graphs in which the horizontal axis represents the time from a start of input of power to an antenna from a first radio-frequency power source and the vertical axis represents the voltage that is applied to each ESC electrode, and FIG. 8C is a conceptual graph in which the horizontal axis is the same as that of each of FIGS. 8A and 8B and the vertical axis represents the power that is input to the antenna.

FIG. 9 is a conceptual graph showing an operation of a plasma processing apparatus according to the second embodiment of the invention in which the horizontal axis represents the time from a start of lowering of the support portion and the vertical axis represents the voltage applied to the ESC electrodes.

FIG. 10 is a conceptual graph showing an operation of a plasma processing apparatus according to the third embodiment of the invention in which the horizontal axis represents the time from a start of lowering of the support portion and the vertical axis represents the voltage applied to the ESC electrodes.

FIGS. 11Ca and 11Cb are conceptual diagrams, in which FIG. 11Ca shows a positional relationship between ring-shaped electrodes and the conveyance carrier as another modification of the ring-shaped electrodes of FIG. 11A and the conveying carrier, and FIG. 11Cb shows a relationship between the ring-shaped electrodes and a DC power source.

FIG. 12A to 12C are conceptual graphs showing an operation of a plasma processing apparatus according to the fourth embodiment in which the horizontal axes represent the time from a start of lowering of the support portion and the vertical axes represent the voltages applied to the respective pairs of ring-shaped electrodes.

FIGS. 13A to 13E are conceptual diagrams showing an operation of the plasma processing apparatus according to the fourth embodiment.

FIG. 14Ba to 14Bc are conceptual graphs showing an operation of a plasma processing apparatus according to the fifth embodiment in which the horizontal axes represent the time from a start of lowering of the support portion and the vertical axes represent the voltages applied to the respective pairs of ring-shaped electrodes (pattern B).

DETAILED DESCRIPTION

Figure 1A:
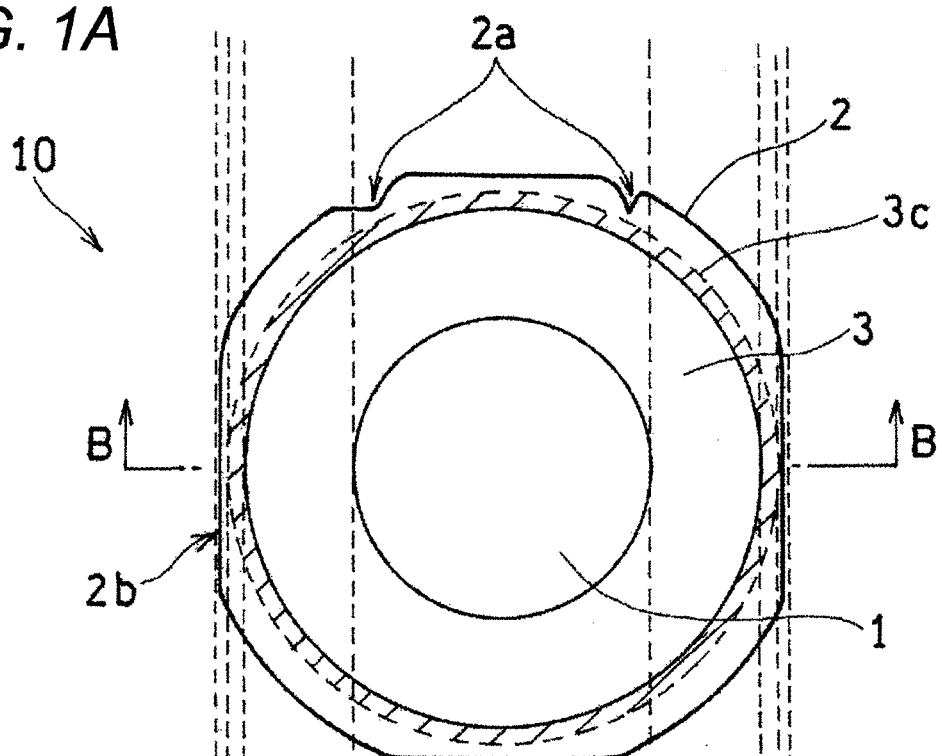
FIG. 1A is a schematic top view of a conveyance carrier used in embodiments of the present invention which holds a substrate.
Figure 1B:
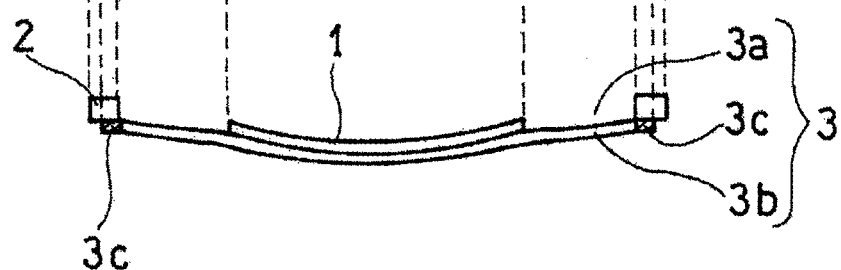
FIG. 1B is a sectional view taken along line B-B in FIG. 1A.

Embodiments of the present invention will be hereinafter described in detail with reference to the drawings. FIG. 1A is a schematic top view of a conveyance carrier 10 used in the embodiments, and FIG. 1B is a sectional view, taken along line B-B in FIG. 1A, of the conveyance carrier 10 in a no load state. Although a frame 2 and a substrate 1 are circular in FIGS. 1A and 1B, the invention is not limited to such a case.

As shown in FIG. 1A, the conveyance carrier 10 is equipped with the frame 2 and a holding sheet 3 that holds the substrate 1. An outer circumferential portion 3c of the holding sheet 3 is fixed to the frame 2. The substrate 1 is bonded to the holding sheet 3 and thereby held by the conveyance carrier 10. The outer circumferential portion 3c occupies an overlap region between the holding sheet 3 and the frame 2. In FIGS. 1A and 1B, the outer circumferential portion 3c is hatched just for the sake of convenience.

The substrate 1 is a processing object of plasma processing such as plasma dicing. The substrate 1 is produced by forming a circuit layer of semiconductor circuits, electronic components, MEMS devices, etc. on one surface of a substrate body (made of Si, GaAs, SiC, or the like) and decreasing its thickness by grinding the back side, opposite to the circuit layer, of the substrate body. Usually, the substrate 1 is as very thin as about 25 to 150 µm and hence has almost no self-supportiveness (rigidity) in itself. As the substrate 1 becomes thinner, it becomes more prone to warp or bend due to an internal stress difference between the circuit layer and the substrate body. When the substrate 1 warps or bends, it becomes difficult to, for example, convey or cool the substrate 1 in performing plasma processing on it.

In view of the above, the outer circumferential portion 3c of the holding sheet 3 is fixed to the frame 2 which is approximately flat in such a state that the holding sheet 3 is under tension and the substrate 1 is bonded to the holding sheet 3. The holding sheet 3 is a resin sheet of about 50 to 150 μm in thickness and is rigid enough to be able to hold the substrate 1. One surface of the holding sheet 3 is formed with an adhesive layer and the substrate 1 is bonded to the adhesive layer. In this manner, in the conveyance carrier 10, the substrate 1, the holding sheet 3, and the frame 2 can be set approximately in the same plane. This facilitates handling of the substrate 1 such as its conveyance and its cooling during the plasma processing in performing plasma processing on it.

However, where the substrate 1 is bonded to the holding sheet 3 whose outer circumferential portion 3c is fixed to the frame 2, the holding sheet 3 may warp as shown in FIG. 1B. In FIG. 1B, the warp is exaggerated to facilitate understanding.

Four possible causes of a warp of the holding sheet 3 will be described below.

The first cause is of a case that the holding sheet 3 warps due to distortion of the frame 2. Although the frame 2 is designed so as to be flat, it may be rendered low in flatness due to variations in manufacture, allowances of manufacture, repeated use in manufacture, and other factors. If the frame 2 used is low in flatness, the holding sheet 3 warps that is fixed to the frame 2.

The second cause is of a case that the holding sheet 3 warps due to the shape of the substrate 1. The conveyance carrier 10 holds the substrate 1 so that it is kept approximately flat because the holding sheet 3 is under tension. However, for example, where the substrate 1 has a cut such as orientation flat, tension does not act on the substrate 1 uniformly from the holding sheet 3. In this case, a portion of the holding sheet 3 around the orientation flat is wrinkled to cause the holding sheet 3 to warp.

The third cause is of a case that the holding sheet 3 warps due to gravity. The conveyance carrier 10 holds the substrate 1 so that it is kept approximately flat because the holding sheet 3 is under tension. However, the holding sheet 3 elongates or the frame 2 is distorted due to the weights of the substrate 1 and the holding sheet 3 themselves, to cause a warp of the holding sheet 3.

The fourth cause is of a case that the holding sheet 3 warps due to stress that acts on the substrate 1. The substrate 1 receives stress that causes it to warp. On the other hand, the adhesion of the bonding of the substrate 1 to the holding sheet 3 and the tension that is exerted from the holding sheet 3 to the substrate 1 act against the stress on the substrate 1 and suppress the warp of the substrate 1 to keep it approximately flat. However, if the stress acting on the substrate 1 is too strong, the holding sheet 3 cannot suppress the warp of the substrate 1 sufficiently, as a result of which the holding sheet 3 expands and warps.

The electrostatic chuck electrode(s) (ESC electrode(s)) is generally classified into two types, that is, a single polarity type and a double polarity type. When a voltage is applied to the ESC electrode, absorption force acts between the ESC electrode and the holding sheet 3, whereby the conveyance carrier 10 can be absorbed on a stage 111.

The single-polarity ESC electrode consists of at least one electrode and a voltage of a fixed polarity is applied to all the electrodes. An electrostatic chuck mechanism having a single-polarity ESC electrode has an absorption mechanism that utilizes Coulomb force. By applying a voltage to the ESC electrode, charge is induced in the surface of the stage 111 by dielectric polarization and the conveyance carrier 10 that is placed on the stage 111 is charged. As a result, Coulomb force acts between the charge induced in the surface of the stage 111 and the conveyance carrier 10 that is charged, whereby the conveyance carrier 10 is absorbed on the stage 111. The conveyance carrier 10 may be charged by generating plasma in a reaction chamber 103 and having the conveyance carrier 10 exposed to the plasma.

Figure 3:
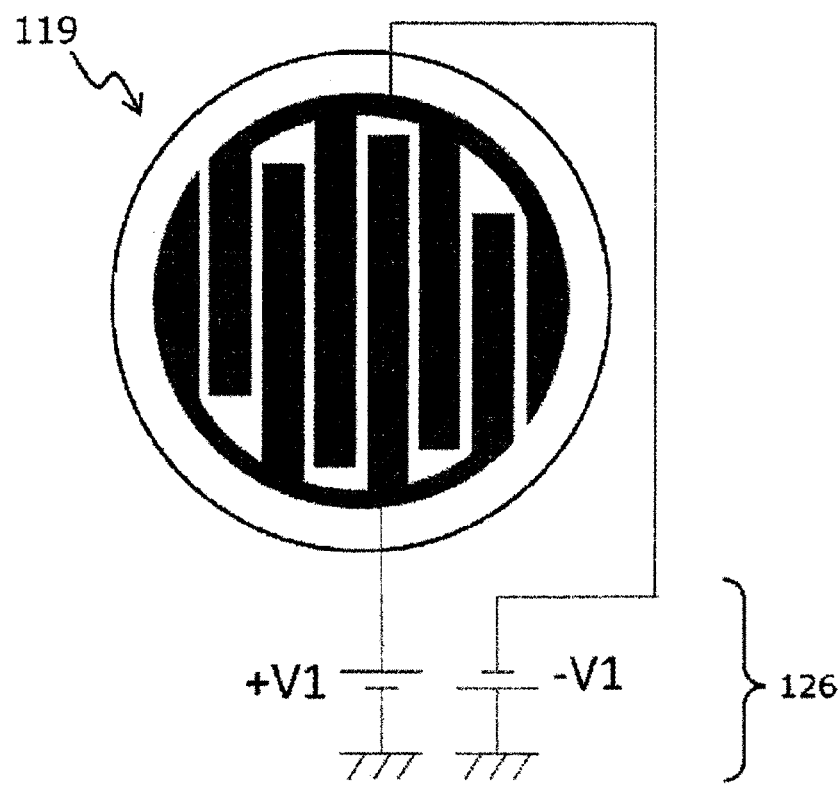
FIG. 3 is a conceptual diagram showing a relationship between ESC electrodes and a DC power source in the first to third embodiments.

On the other hand, the double-polarity ESC electrodes have a positive electrode and a negative electrode to which voltages of different polarities are applied, respectively. Comb electrodes 119 shown in FIG. 3 are an example of the double-polarity ESC electrodes. As shown in FIG. 3, voltages V1 and −V1 are applied to the positive electrode and the negative electrode, respectively.

The absorption mechanism of the electrostatic chuck mechanism that is equipped with the double-polarity ESC electrodes is classified into one that utilizes Coulomb force and one that utilizes Johnsen-Rahbek force. A proper electrode structure and material (e.g., ceramic) are selected according to the absorption mechanism. In either absorption mechanism, voltages of different polarities are applied to the positive electrode and the negative electrode, whereby absorption force acts between the ESC electrodes and the conveyance carrier 10 and the conveyance carrier 10 can be absorbed on the stage 111. With the double-polarity ESC electrodes, unlike with the single-polarity ESC electrode, it is not necessary to charge the conveyance carrier 10 to have it absorbed.

It is possible to cause the double-polarity ESC electrodes to function as single-polarity ESC electrodes by employing a proper method for applying voltages to the positive electrode and the negative electrode, more specifically, by applying voltages of the same polarity to the positive electrode and the negative electrode. In the following description, a mode in which voltages of different polarities are applied to the positive electrode and the negative electrode of the double-polarity ESC electrodes is called a double-polarity mode, and a mode in which voltages of the same polarity are applied to the positive electrode and the negative electrode is called a single-polarity mode.

In the single-polarity mode, voltages of the same polarity are applied to the positive electrode and the negative electrode and an absorption mechanism that utilizes Coulomb force is employed. Unlike in the double-polarity mode, the conveyance carrier 10 cannot be absorbed merely by applying voltages to the positive electrode and the negative electrode. In the single-polarity mode, to have the conveyance carrier 10 absorbed, it is necessary to charge the conveyance carrier 10. To this end, plasma is generated in the reaction chamber 103 and the conveyance carrier 10 is exposed to the plasma. As a result, the conveyance carrier 10 is charged and thereby absorbed on the stage 111.

The single-polarity ESC electrode and the double-polarity ESC electrodes have been described above. In either case, it is possible to have the conveyance carrier 10 absorbed on the stage 111.

As described above, when a conveyance carrier 10 having a warped holding sheet 3 is mounted on the stage 111, the holding sheet 3 or the substrate 1 itself may be wrinkled. Such wrinkles may develop in either a region of the holding sheet 3 where it is not in contact with the substrate 1 or a region of the holding sheet 3 where it is in contact with the substrate 1. In the latter case, the substrate 1 itself that is bonded to the holding sheet 3 may be wrinkled.

Usually, to prevent the conveyance carrier 10 from being heated by plasma irradiation and thereby damaged thermally, the stage 111 is cooled to, for example, 15° C. or less. By cooling the stage 111, the conveyance carrier 10 that is mounted on the stage 111 is also cooled and is suppressed in thermal damage.

However, the holding sheet 3 may shrink when it is brought in contact with the cooled stage 111. Since the outer circumferential portion 3c of the holding sheet 3 is fixed to the frame 2, shrinkage of the holding sheet 3 is a cause of wrinkling of the holding sheet 3.

When a wrinkled conveyance carrier 10 is mounted on the stage 111 by the electrostatic chuck mechanism, at least a part of the wrinkles of the holding sheet 3 cannot come into contact with the stage 111 and the holding sheet 3 is absorbed on the stage 111 in such a manner that portions of the holding sheet 3 are elevated from the stage 111. If plasma processing is performed in a state such elevated portions occur in the region of the holding sheet 3 where it is in contact with the substrate 1, the degree of etching is made different between the elevated portions and the other portions to cause variations in processing result shapes or unprocessed portions. Furthermore, irrespective of where elevated portions are formed, local temperature increase or abnormal discharge may occur in the elevate portions. Such temperature increase or abnormal discharge may damage the substrate 1, the holding sheet 3, or the ESC electrode(s).

Still further, in a picking-up step which is executed after the plasma processing, wrinkling of the holding sheet 3 makes it difficult to recognize chips correctly, possibly resulting in pickup errors. In a subsequent appearance inspection step, trouble may occur that good products cannot be discriminated correctly from defective ones.

First to third embodiments in the invention are described below. In the first to third embodiments of the invention, before mounting the conveyance carrier 10 on the stage 111, application of a voltage(s) to the ESC electrode(s) is started, whereby the holding sheet 3 is absorbed on the stage 111 in a state that the holding sheet 3 is not wrinkled.

(Plasma Processing Apparatus)

Figure 2:
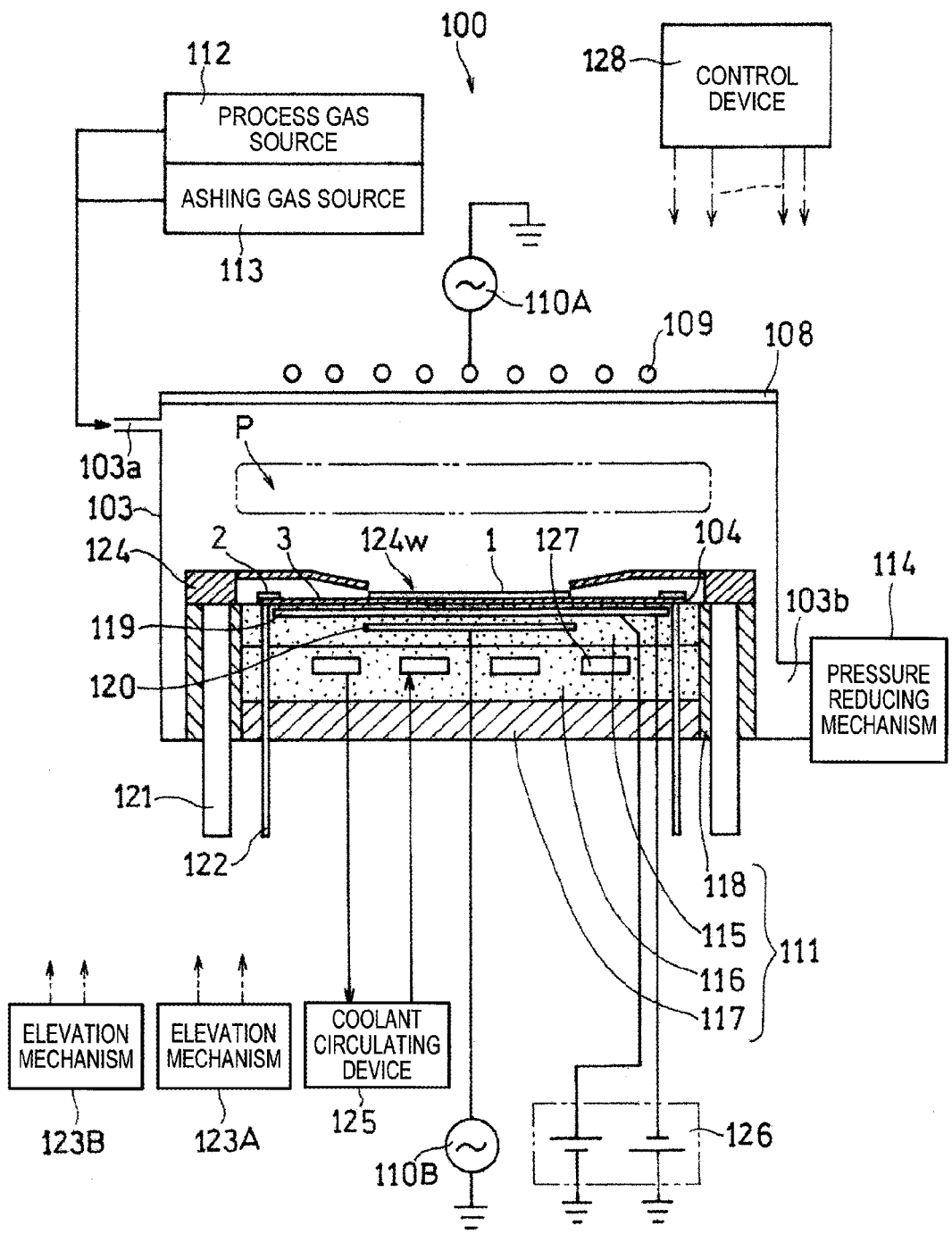
FIG. 2 is a conceptual diagram of a plasma processing apparatus according to first to third embodiments.

First, a plasma processing apparatus 100 according to the embodiments of the invention will be described with reference to FIG. 2. FIG. 2 is a schematic sectional view of the plasma processing apparatus 100 according to the embodiments of the invention.

The plasma processing apparatus 100 is equipped with the stage 111. The conveyance carrier 10 is mounted on the stage 111 in such a manner that the surface (adherent surface 3a) that holds a substrate 1 is up. A cover 124 which covers the frame 2 and at least a part of the holding sheet 3 and has a window 124W for exposing at least a part of the substrate 1 is disposed over the stage 111.

The stage 111 and the cover 124 are disposed in the reaction chamber (vacuum chamber) 103. The top of the vacuum chamber 103 is closed by a dielectric member 108, and an antenna 109 as a top electrode is disposed over the dielectric member 108. The antenna 109 is electrically connected to a first radio-frequency power source 110A. The stage 111 is disposed at the bottom of the reaction chamber 103.

A gas inlet 103a is connected to the vacuum chamber 103. A process gas source 112 which is a source of a plasma generation gas and an ashing gas source 113 are connected to the gas inlet 103a via respective pipes. The vacuum chamber 103 has an exhaust outlet 103b, and a pressure reducing mechanism 114 which includes a vacuum pump and serves to reduce the pressure in the vacuum chamber 103 by exhausting gas inside it is connected to the exhaust outlet 103b.

The stage 111 is equipped with an approximately circular electrode layer 115 and metal layer 116, a base stage 117 which supports the electrode layer 115 and the metal layer 116, and an outer circumference portion 118 which surrounds the electrode layer 115, the metal layer 116, and the base stage 117. Disposed inside the electrode layer 115 are electrode(s) (hereinafter referred to as an ESC electrode(s)) 119 which is part of the electrostatic chuck mechanism, and a radio-frequency electrode member 120 which is electrically connected to a second radio-frequency power source 110B.

A DC power source 126 is electrically connected to the ESC electrode 119. The electrostatic chuck mechanism consists of the ESC electrode 119 and the DC power source 126.

For example, the metal layer 116 is an aluminum layer having a surface alumite coating. A coolant passage 127 is formed inside the metal layer 116 and serves to cool the stage 111. When the stage 111 is cooled, the conveyance carrier 10 that is mounted on the stage 111 is cooled and the cover 124 part of which is in contact with the stage 111 is also cooled. Coolant is circulated along the coolant passage 127 by a coolant circulating device 125.

Plural support portion 122 is disposed so as to penetrate through the stage 111 at positions near its outer circumference, and is driven, that is, elevated or lowered, by an elevation mechanism 123A. When the top surface of the support portion 122 is located at a transfer position that is distant from the stage 111 upward, a conveyance carrier 10 is conveyed into the vacuum chamber 103 by a conveying mechanism (not shown) and transferred to the support portion 122. At this time, the support portion 122 supports the frame 2 of the conveyance carrier 10. Even desirably, the support portion 122 supports the overlap portion (i.e., the outer circumferential portion 3c of the holding sheet 3) between the frame 2 and the holding sheet 3 of the conveyance carrier 10.

When the top surface 122a of the support portion 122 is lowered to the same or lower level as or than the surface of the stage 111, the conveyance carrier 10 is mounted on the stage 111 at a prescribed position. Plasma processing is performed on the conveyance carrier 10 being mounted on the stage 111.

Plural elevation rods 121 are connected to an end portion of the cover 124 so that the cover 124 can be elevated and lowered. The elevation rods 121 are driven, that is, elevated or lowered by an elevation mechanism 123B. The elevation mechanism 123B can perform an elevation/lowering operation of the cover 124 independently of the elevation mechanism 123A.

A control device 128 controls operations of constituent elements of the plasma processing apparatus 100 which include the first radio-frequency power source 110A, the second radio-frequency power source 110B, the process gas source 112, the ashing gas source 113, the pressure reducing mechanism 114, the coolant circulating device 125, the elevation mechanisms 123A and 123B, and the electrostatic chuck mechanism.

(Frame)

The frame 2 is a frame body having an opening that is the same as or larger than the entire substrate 1 in area, and has a prescribed width and a small, approximately constant thickness. The frame 2 is rigid enough to hold and enable conveyance of the holding sheet 3 and the substrate 1.

Although there are no limitations on the shape of the opening of the frame 2, it may have a polygonal shape such as a circle, rectangle, or hexagon. The frame 2 may have notches 2a, corner cuts 2b, etc. for positioning. Example materials of the frame 2 are metals such as aluminum and stainless steel and resins. Part of one surface 3a of the holding sheet 3, that is, one surface of its outer circumferential portion 3c, is bonded to one surface of the frame 2.

(Holding Sheet)

For example, the holding sheet 3 has a surface having an adhesive (adherent surface 3a) and a surface having no adhesive (non-adherent surface 3b). Part of the adherent surface 3a, that is, one surface of its outer circumferential portion 3c, is bonded to one surface of the frame 2. The substrate 1 is bonded to a portion, exposed through the opening of the frame 2, of the adherent surface 3a.

It is preferable that the adherent surface 3a have an adhesive component whose adhesiveness is weakened when illuminated with ultraviolet light. This is to allow individual substrate portions (i.e., chips) to be peeled off the adherent surface 3a and picked up easily when they are illuminated with ultraviolet light after dicing. For example, the holding sheet 3 may be composed of an ultraviolet-curing acrylic adhesive layer (having the adherent surface 3a) and a polyolefin base sheet (having the non-adherent surface 3b). In this case, it is preferable that the thickness of the ultraviolet-curing acrylic adhesive layer be 5 to 20 μm and thickness of the polyolefin base sheet be 50 to 150 μm.

The holding sheet 3 may be conductive. Where the single-polarity ESC electrode or the double-polarity ESC electrodes that operate in the single-polarity mode are used, high absorption ability is obtained with respect to the stage 111 irrespective of whether the holding sheet 3 is conductive or not. On the other hand, where the double-polarity ESC electrodes that operate in the double-polarity mode are used, the absorption ability with respect to the stage 111 becomes low if the conductivity of the holding sheet 3 is low. Therefore, the conductive holding sheet 3 is particularly useful when the double-polarity ESC electrodes operate in the double-polarity mode because the conductive holding sheet 3 increases the absorption ability with respect to the stage 111.

(Substrate)

The substrate 1, which is an object of plasma processing, is not limited in any manner. There are no limitations on the material of the substrate 1. The substrate 1 may be a semiconductor, a dielectric, a metal, or a laminate thereof. Example semiconductors are silicon (Si), gallium arsenide (GaAs), gallium nitride (GaN), silicon carbide (SiC). Example dielectrics are silicon dioxide ($SiO_2$), silicon nitride ($Si_3N_4$), polyimide, lithium tantalate ($LiTaO_3$), and lithium niobate ($LiNbO_3$). There are no limitations on the size of the substrate 1, either. For example, the maximum diameter is about 50 to 300 mm and the thickness of the substrate 1 is about 25 to 150 μm. Furthermore, there are no limitations on the shape of the substrate 1. For example, the substrate 1 may be circular or rectangular. The substrate 1 may have a cut(s) (not shown) such as orientation flat or notches.

That surface of the substrate 1 which is not bonded to the holding sheet 3 is formed with a resist mask (not shown) in a desired pattern. The portions on which the resist mask is formed are protected from plasma etching. The portions on which the resist mask is not formed are etched by plasma from its front surface to back surface.

(Electrostatic Chuck Mechanism)

The applies a voltage(s) to the ESC electrode(s) 119 disposed inside the stage 111 (electrode layer 115) from the DC power source 126 and thereby having the conveyance carrier 10 absorbed on the stage 111 utilizing Coulomb force or Johnsen-Rahbek force that acts between the conveyance carrier 10 and the stage 111. The ESC electrode 119 is disposed so that their center approximately coincides with the center of the stage 111. The center of a minimum circle that contains all of the ESC electrode 119 can be regarded as the center of the ESC electrode 119.

The ESC electrode(s) 119 may be of either the double-polarity type (operating in the double-polarity mode or the single-polarity mode) or the single-polarity type. Where the ESC electrode(s) 119 is a single-polarity type ESC electrode or double-polarity type ESC electrodes operating in the single-polarity mode, the DC power source 126 and the first radio-frequency power source 110A are activated, whereby the conveyance carrier 10 is absorbed on the stage 111. More specifically, plasma is generated in the reaction chamber 103 and the surface of the conveyance carrier 10 is charged by activating the first radio-frequency power source 110A and a voltage(s) is applied to the single-polarity ESC electrode 119 or the double-polarity type ESC electrodes 119 operating in the single-polarity mode by activating the DC power source 126, whereby absorption force is generated between the conveyance carrier 10 and the stage 111.

Where the double-polarity type ESC electrodes 119 operate in the double-polarity mode, the DC power source 126 is activated, whereby the conveyance carrier 10 is absorbed on the stage 111. More specifically, absorption force is generated between the conveyance carrier 10 and the stage 111 by applying voltages of different polarities to the positive electrode and the negative electrode of the ESC electrodes 119 by activating the DC power source 126. The following description will be directed to the case that the ESC electrodes 119 are double-polarity type ESC electrodes. However, the invention is not limited to such a case.

FIG. 3 schematically shows a relationship between the double-polarity type ESC electrodes 119 and the DC power source 126. For example, the ESC electrodes 119 are comb electrodes as shown in FIG. 3. In FIG. 3, a positive voltage V1 and a negative voltage −V1 are applied to the positive electrode and the negative electrode, respectively. However, the shape of the ESC electrodes 119 is not restricted to it and may be determined as appropriate.

The control device 128 controls the voltage application to the ESC electrodes 119 according to the operation of the support portion 122. In mounting the conveyance carrier 10 on the stage 111, the electrostatic chuck mechanism starts applying voltages to the ESC electrodes 119 before contact of the outer circumferential portion 3c of the holding sheet 3 to the stage 111.

There are no limitations on the timing of a start of voltage application to the ESC electrodes 119 as long as it is before contact of the outer circumferential portion 3c of the holding sheet 3 to the stage 111. For example, voltage application may be started before contact of the holding sheet 3 to the stage 111, that is, before contact of the lowest point of a warped portion of the holding sheet 3 (hereinafter, referred to as warped portion) to the stage 111. For another example, voltage application may be started after contact of the point of a warped portion of the holding sheet 3 to the stage 111 before contact of the outer circumferential portion 3c of the holding sheet 3 to the stage 111.

The first to third embodiments of the invention will be described below in detail. However, the invention is not limited to these embodiments and various modifications are possible.

First Embodiment

Figure 4:
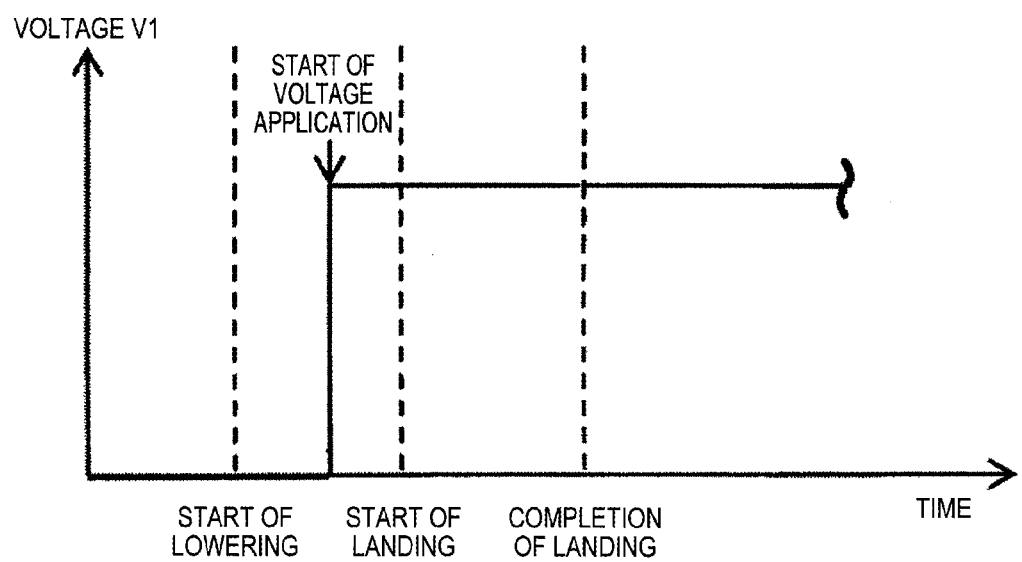
FIG. 4 is a conceptual graph showing an operation of a plasma processing apparatus according to the first embodiment of the invention in which the horizontal axis represents the time from a start of lowering of support portion and the vertical axis represents the voltage(s) applied to the ESC electrode(s).

In the first embodiment, voltage application is started before contact of the lowest point of a warped portion of the holding sheet 3 to the stage 111. FIG. 4 is a conceptual graph in which the horizontal axis represents the time from a start of lowering of the support portion 122 and the vertical axis represents the voltage(s) applied to the ESC electrode(s) 119. A time point when the support portion 122 that support the conveyance carrier 10 start to be lowered is indicated in FIG. 4. The term "start of landing" means a time point when the lowest point of a warped portion of the holding sheet 3 of the conveyance carrier 10 just comes into contact with the stage 111. The term "completion of landing" means a time point when the top surface 122a of the support portion 122 have been lowered to the same or lower level as or than the surface of the stage 111 and (at least a part of) the outer circumferential portion 3c of the holding sheet 3 just comes into contact the stage 111.

Whether or not the lowest point of the warped portion of the holding sheet 3 has touched the stage 111 is determined on the basis of, for example, a distance D of lowering of the top surface 122a of the support portion 122. A warp Tc (described later) of the holding sheet 3 that is held by the conveyance carrier 10 is measured, and a lowering distance D of the support portion 122 that occurs when the distance T between the top surface 122a of the support portion 122 and the surface of the stage 111 becomes equal to Tc is recognized in advance. A time point when the lowering distance of the support portion 122 has become equal to D is regarded as a time point when the lowest point of the warped portion of the holding sheet 3 being held by the conveyance carrier 10 has just touched the stage 111.

Figure 5:
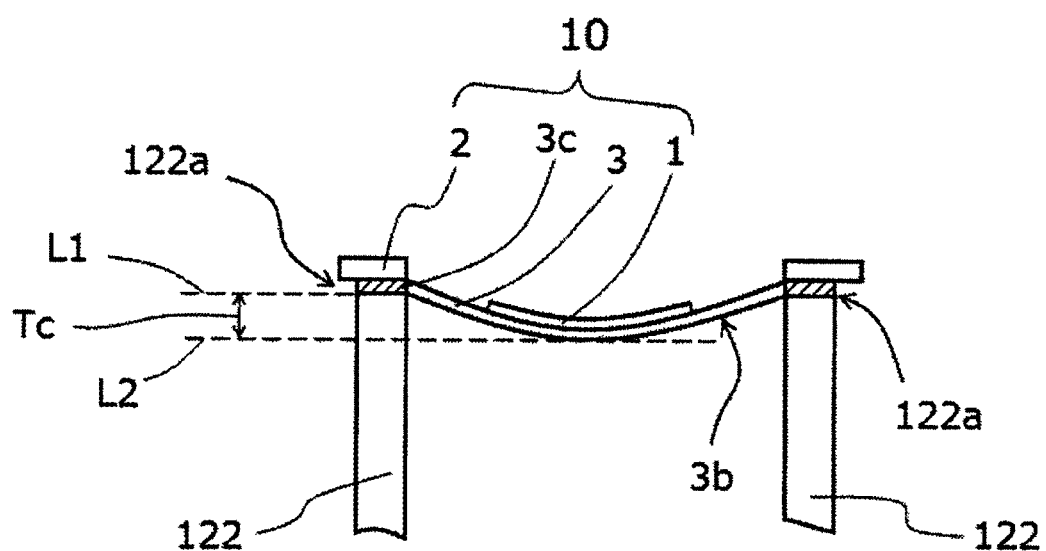
FIG. 5 illustrates a warp of a holding sheet that occurs in the first embodiment.

For example, a warp Tc is determined in the following manner. As shown in FIG. 5, the conveyance carrier 10 is placed on the top surface 122a of the support portion 122 that is located at such a height that the holding sheet 3 is not in contact with the stage 111. In this state, in a cross section taken so as to pass the center of the conveyance carrier 10, the warp Tc is determined as a shortest distance between a straight line L1 that passes the bottom surface 3b of the outer circumferential portion 3c of the holding sheet 3 and a tangential line L2 to the bottom surface (3b) of a warped portion of the holding sheet 3.

It is not always necessary to measure a warp Tc in the reaction chamber 103 or the plasma processing apparatus 100. For example, a warp Tc may be measured by, for example, a noncontact optical measuring instrument before processing by the plasma processing apparatus 100. To facilitate understanding, the warp Tc is exaggerated in FIG. 5. For example, a warp Tc of about 50 to 800 μm occurs in the case where the diameter of the frame 2 is about 300 mm, the diameter and the thickness of the substrate 1 are about 150 mm and about 100 μm, respectively, and the thickness of the holding sheet 3 is about 110 μm.

FIGS. 6A to 6D conceptually show an operation from a start of lowering of the support portion 122 that supports the conveyance carrier 10 to mounting of the conveyance carrier 10 on the stage 111. To facilitate understanding, the ESC electrode(s) 119 to which a voltage(s) is applied is hatched in FIGS. 6A to 6D. Also in FIGS. 6A to 6D, warps are exaggerated for the sake of description.

Figure 6A:
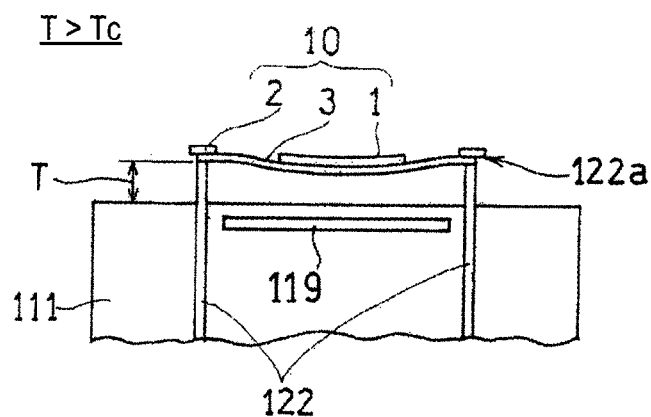
FIGS. 6A to 6D are conceptual diagrams showing an operation of the plasma processing apparatus according to the first embodiment from a start of lowering of the support portion to mounting of the conveyance carrier on a stage.
Figure 6B:
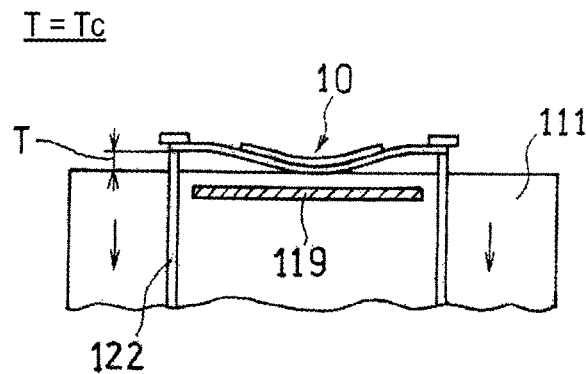
Figure 6C:
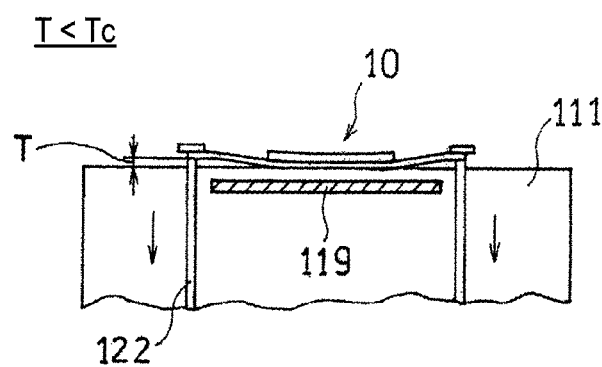
Figure 6D:
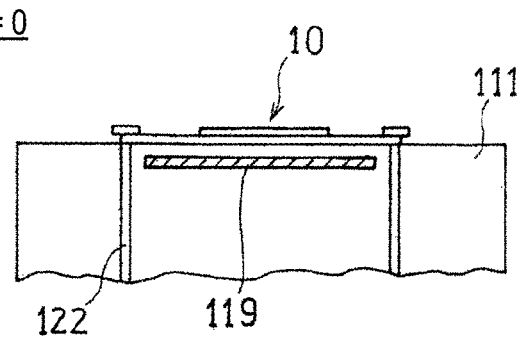

As shown in FIG. 6A, first, the support portion 122 that supports the conveyance carrier 10 starts to be lowered. At this time, the distance T between the top surface 122a of the support portion 122 and the stage 111 is longer than the warp Tc (T>Tc). A voltage(s) is applied to the ESC electrode(s) 119 after the start of lowering of the support portion 122. The support portion 122 continues to be lowered, and the lowest point of the warped portion of the holding sheet 3 comes into contact with the stage 111 (T=Tc) and, at the same time, the contact portion is absorbed on the stage 111 (see FIG. 6B). As the support portion 122 still continues to be lowered, a portion of the holding sheet 3 newly brought into contact with the stage 111 is immediately absorbed on the stage 111 (see FIGS. 6C and 6D).

Since the holding sheet 3 is absorbed on the stage 111 gradually starting from the lowest point of a warped portion, it is not prone to be wrinkled. A portion of the holding sheet 3 newly brought into contact with the stage 111 is absorbed on the stage 111 upon the contact. Therefore, even where the stage 111 is being cooled, a contact potion of the holding sheet 3 is absorbed before being contracted. Thus, the holding sheet 3 is absorbed to the stage 111 in a state that it is not wrinkled. As a result, the substrate 1 is etched uniformly in plasma processing that is performed subsequently. This leads to increase in production yield.

How the plasma processing apparatus 100 operates will be described below in a specific manner with reference to FIGS. 7A to 7E. Also in FIGS. 7A to 7E, warps are exaggerated to facilitate understanding of the description.

Figure 7A:
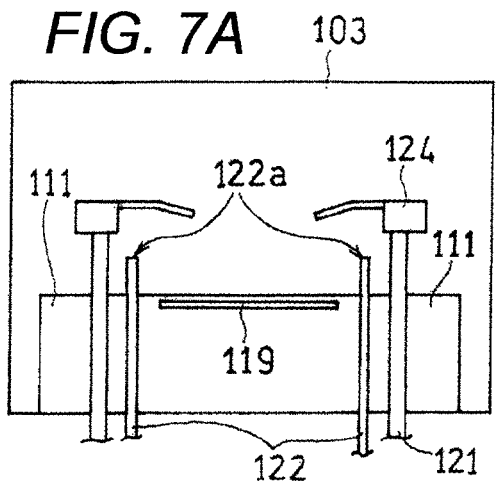
FIGS. 7A to 7E are conceptual diagrams showing an operation of the plasma processing apparatus according to the first embodiment.

In the vacuum chamber 103, as shown in FIG. 7A, the support portion 122 stands by at the elevated position for support of the conveyance carrier 10 and the cover 124 also stands by at the elevated position. As shown in FIG. 7B, the conveyance carrier 10 is carried into the vacuum chamber 103 by the conveying mechanism (not shown) and transferred to the support portion 122.

The conveyance carrier 10 is placed on the top surface 122a of the support portion 122 in such a manner that the surface (adherent surface 3a), holding the substrate 1, of the holding sheet 3 is located up. The frame 2 may be placed on the top surface 122a of the support portion 122 either via the outer circumferential portion 3c of the holding sheet 3 or directly. From the viewpoint of preventing the holding sheet 3 from peeling off the frame 2 when the support portion 122 is elevated or lowered, it is preferable that the conveyance carrier 10 be placed on the top surface 122a of the support portion 122 via the outer circumferential portion 3c of the holding sheet 3.

Figure 7D:
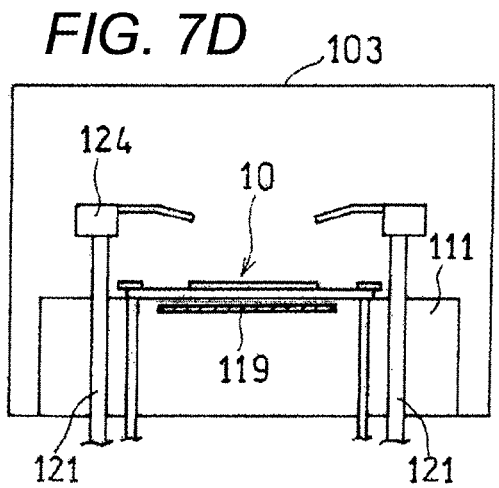
Figure 7B:
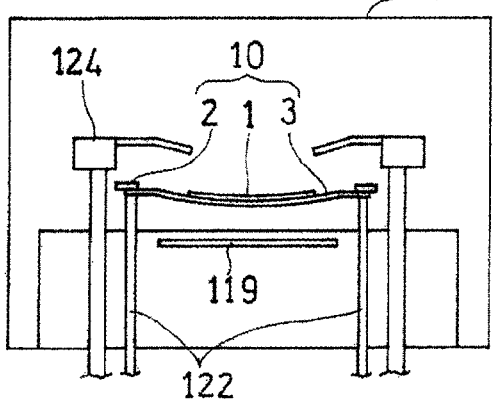
Figure 7E:
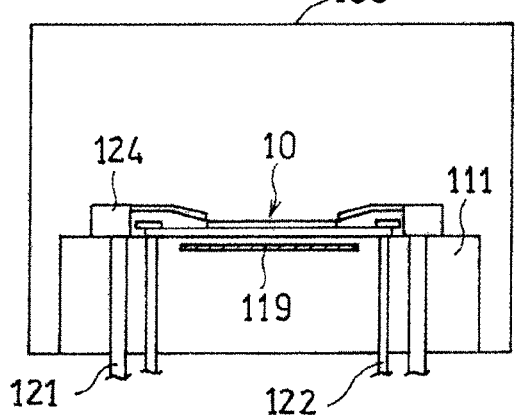
Figure 7C:
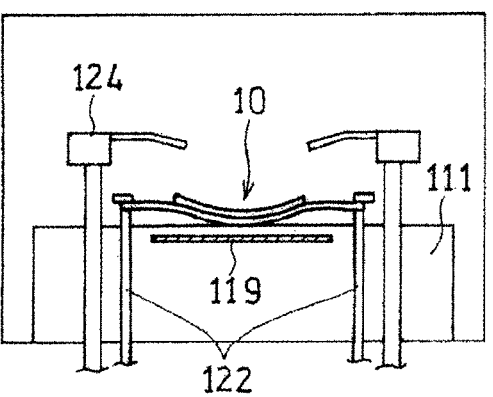

Next, the support portion 122 is lowered as shown in FIG. 7C. The DC power source 126 applies voltage to the ESC electrode 119 after the transfer of the conveyance carrier 10 to the support portion 122 before contact of the lowest point of the holding sheet 3 to the stage 111.

Where the ESC electrode 119 is of the single-polarity type, plasma is generated in the vacuum chamber 103 by inputting low power (e.g., 500 W or less) to the antenna 109 from the first radio-frequency power source 110A after the placement of the conveyance carrier 10 on the top surface 122a of the support portion 122 and the exit of the conveying mechanism from the vacuum chamber 103 before application of a voltage to the ESC electrode 119. As a result, the surface of the conveyance carrier 10 is charged to establish a state that the conveyance carrier 10 can be absorbed on the stage 111 upon application of a voltage to the ESC electrode 119.

Then the support portion 122 is lowered further, whereby the outer circumferential portion 3c of the holding sheet 3 comes into contact with the stage 111, and the conveyance carrier 10 is mounted on the stage 111 at the prescribed position (see FIG. 7D). If the top surface 122*a* of the support portion 122 has been lowered to the same or lower level as or than the surface of the stage 111, it can be determined that the outer circumferential portion 3*c* of the holding sheet 3 is in contact with the stage 111.

When the top surface 122*a* has been lowered to the same or lower level as or than the surface of the stage 111, as shown in FIG. 7E, the elevation rods 121 are driven by the elevation mechanism 123B and thereby lower the cover 124 to a prescribed position.

When the cover 124 has been set at the prescribed lowered position, the frame 2 and the portion of the holding sheet 3 that is not holding the substrate 1 are covered with the cover 124 without being in contact with it and the substrate 1 is exposed through the window 124W of the cover 124.

For example, the portion, excluding the end portion, of the cover 124 has a doughnut shape having an approximately circular outline and has a prescribed width and a small thickness. The inner diameter (i.e., the diameter of the window 124W) and the outer diameter of the portion, excluding the end portion, of the cover 124 is smaller than the inner diameter of the frame 2 and larger than the outer diameter of the frame 2, respectively. Therefore, when the conveyance carrier 10 is mounted on the stage 111 at the prescribed position and the cover 124 has been lowered, the frame 2 and at least a part of the holding sheet 3 can be covered with the cover 124. At least a part of the substrate 1 is exposed through the window 124W. At this time, the cover 124 is in contact with none of the frame 2, the holding sheet 3, and the substrate 1. Example materials of the cover 124 are ceramic materials such as alumina and aluminum nitride, dielectrics such as quartz, and metals such as aluminum (including a case that the surface is alumite-treated).

When the support portion 122 and the cover 124 have been set at the prescribed positions, process gas is introduced into the vacuum chamber 103 from the process gas source 112 via the gas inlet 103*a*. On the other hand, the pressure reducing mechanism 114 exhausts gas from the vacuum chamber 103 via the exhaust outlet 103*b* to maintain a prescribed pressure in the vacuum chamber 103.

Then plasma P is generated in the vacuum chamber 103 by inputting radio-frequency power to the antenna 109 from the first radio-frequency power source 110A. The generated plasma P is composed of ions, electrons, radicals, etc. Plasma processing on the substrate 1 is started by inputting radio-frequency power to the radio-frequency electrode 120 from the second radio-frequency power source 110B. The energy of incidence of ions on the substrate 1 can be controlled by the bias voltage that is applied from the second radio-frequency power source 110B to the radio-frequency electrode 120. The portions, exposed from the resist mask formed on the substrate 1, of the substrate 1 are removed from their top surfaces to bottom surfaces by a physico-chemical reaction to the generated plasma P, whereby the substrate 1 is divided into individual pieces.

The plasma processing conditions are set according to the material of the substrate and other factors. For example, an Si substrate 1 is etched by generating plasma P of a fluorine-inclusive gas such as sulfur hexafluoride ($SF_6$) in the vacuum chamber 103. In this case, for example, the pressure in the vacuum chamber 103 is controlled to 10 to 50 Pa by the pressure reducing mechanism 114 while an $SF_6$ gas is supplied from the process gas source 112 at 100 to 800 sccm. Radio-frequency power of 1,000 to 5,000 W and 13.56 MHz is supplied to the antenna 109 and radio-frequency power of 50 to 1,000 W and 13.56 MHz is supplied to the radio-frequency electrode 120. At the same time, to suppress temperature increase of the conveyance carrier 10 due to the plasma processing, the temperature of the coolant that is being circulated in the stage 111 by the coolant circulating device 125 is set as −20 to 20° C. As a result, the temperature of the conveyance carrier 10 under plasma processing can be made lower than or equal to 100° C.

It is desirable that in the etching processing the portions, exposed from the resist mask, of the substrate 1 be etched perpendicularly to their surfaces. To this end, for example, an etching step using plasma of a fluorine-based gas such as $SF_6$ and a protection film deposition step using plasma of a carbon fluoride gas such as perfluorocyclobutane ($C_4F_8$) may be executed alternately.

After the generation of plasma P, the operation mode of the ESC electrodes 119 may be switched from the double-polarity mode to the single-polarity mode. Where the operation mode of the ESC electrodes 119 is the double-polarity mode, the surface of the substrate 1 over the positive electrode of the ESC electrodes 119 (positive-electrode-side surface) and the surface of the substrate 1 over the negative electrode of the ESC electrodes 119 (negative-electrode-side surface) are slightly different from each other in potential. Furthermore, the positive-electrode-side surface receives stronger Coulomb force than the negative-electrode-side surface. Therefore, the two kinds of surfaces receive slightly different absorption forces.

As a result, if plasma processing is started in the double-polarity mode, the difference, between the positive-electrode-side surface and the negative-electrode-side surface, in the absorption force acting between the conveyance carrier 10 and the stage 111 causes temperature differences in the substrate 1. Furthermore, the positive-electrode-side surface and the negative-electrode-side surface may have differences in the effective bias voltage applied to the substrate 1. Still further, the positive-electrode-side surface and the negative-electrode-side surface may have differences in the degree of etching. These are factors that may make it difficult to perform uniform plasma processing on the substrate 1.

For example, the switching from the double-polarity mode to the single-polarity mode is made by inverting the polarity of the voltage that is applied to one of the positive electrode and the negative electrode or changing the voltage that is applied to one of the positive electrode and the negative electrode so that it becomes equal to the voltage applied to the other electrode.

When switching is made from the double-polarity mode to the single-polarity mode, there may occur an event that the absorption force between the conveyance carrier 10 and the stage 111 weakens instantaneously and the cooling of the conveyance carrier 10 becomes insufficient. In view of this, it is preferable that the switching from the double-polarity mode to the single-polarity mode be made during a period when low power (e.g., 500 W) is input from the first radio-frequency power source 110A to the antenna 109.

In other words, the operation mode of the ESC electrodes 119 is switched from the double-polarity mode to the single-polarity mode while low-power plasma is being generated by inputting low power to the antenna 109 from the first radio-frequency power source 110A. It is preferable to perform plasma processing by inputting high power to the antenna 109 from the first radio-frequency power source 110A after completion of the switching (see FIG. 7C). Where the power that is input to the antenna 109 is low, the energy of generated plasma is low and hence the amount of heat that is transmitted from the plasma to the conveyance carrier 10 is small. Therefore, the necessity to cause the conveyance carrier 10 to be absorbed on the stage 111 strongly is low. As a result, trouble is less prone to occur due to insufficient cooling of the conveyance carrier 10 when switching is made from the double-polarity mode to the single-polarity mode.

The voltage applied to each ESC electrode 119 may be increased after the switching to the single-polarity mode before a start of plasma processing. FIGS. 7A and 7B are conceptual graphs in which the horizontal axis represents the time from a start of input of power to the antenna 109 from the first radio-frequency power source 110A and the vertical axis represents the voltage that is applied to each ESC electrode 119. As shown in FIGS. 7A and 7B, after the switching to the single-polarity mode, the voltage applied to each ESC electrode 119 is increase to +V2 stepwise so that the conveyance carrier 10 is absorbed on the stage 111 with sufficient strength. Then plasma processing is started by inputting high power to the antenna 109 from the first radio-frequency power source 110A.

The above operation will be described below in a more specific manner. For example, in the double-polarity mode, the positive electrode voltage is 1,500 V (+V1) and the negative electrode voltage is −1,500 V (−V1). And the power that is input to the antenna 109 is low power of 500 W. Then switching is made from the double-polarity mode to the single-polarity mode by changing the negative electrode voltage from −1,500 V (−V1) to 1,500 V (+V1). Subsequently, the positive electrode voltage and the negative electrode voltage are increased stepwise to 3,000 V (+V2). Finally, the power that is input to the antenna 109 is increased to high power of 2,000 to 5,000 W and plasma processing is performed. In this manner, the conveyance carrier 10 can be absorbed on the stage 111 strongly and cooled reliably during plasma processing while occurrence of trouble due to the switching from the double-polarity mode to the single-polarity mode is prevented.

Ashing is performed after the fragmentation. An ashing process gas (e.g., an oxygen gas or a mixed gas of an oxygen gas and a fluorine-inclusive gas) is introduced into the vacuum chamber 103 from the ashing gas source 113. On the other hand, exhaust is performed by the pressure reducing mechanism 114, whereby the pressure in the vacuum chamber 103 is kept at a prescribed value. Oxygen plasma is generated in the vacuum chamber 103 by inputting radio-frequency power from the first radio-frequency power source 110A, whereby the resist mask that is formed on the surface, exposed through the window 124W of the cover 124, of the substrate 1 (chips) is removed completely.

Finally, the conveyance carrier 10 which holds the fragmented substrate 1 is carried out of the plasma processing apparatus 100. The substrate 1 may be carried out according to a procedure that is reverse to the procedure for mounting the substrate 1 on the stage 111 which is shown in FIGS. 6A to 6E. That is, after the cover 124 is elevated to a prescribed position, the absorption of the conveyance carrier 10 on the stage 111 is canceled by decreasing the voltages applied to the ESC electrodes 119 to zero and the support portion 122 is elevated.

If the conveyance carrier 10 is kept absorbed on the stage 111 because part of the charge that was produced at the time of the plasma processing remains in the conveyance carrier 10, if necessary, the residual charge may be removed from the conveyance carrier 10 by generating weak plasma by inputting low radio-frequency power of, for example, about 200 W to the antenna 109 from the first radio-frequency power source 110A before or during the elevation of the top surface 122a of the support portion 122.

Although applicable to any of the above-described first to fourth cases that may cause a warp of a holding sheet 3, the embodiment is particularly useful when applied to the case that the frame 2 is distorted. If the frame 2 has no distortion, the conveyance carrier 10 can be mounted on the stage 111 so as to be almost flat. On the other hand, if the frame 2 is distorted, the substrate 1 and the holding sheet 3 which are thin and light are elevated from the stage 111 due to the distortion of the frame 2 to form a gap between the stage 111 and themselves. Or the substrate 1 and the holding sheet 3 are wrinkled due to the distortion of the frame 2.

In the embodiment, the holding sheet 3 and the substrate 1 are absorbed on the stage 111 by starting voltage application to the ESC electrode(s) 119 before contact of the outer circumferential portion 3c of the holding sheet 3 to the stage 111. That is, the holding sheet 3 and the substrate 1 are absorbed on the stage 111 before mounting of the frame 2 on the stage 111. As a result, elevation of the holding sheet 3 and the substrate 1 can be suppressed even if the frame 2 is distorted. As a result, formation of a gap between the stage 111 and themselves and wrinkling of them can be suppressed.

Second Embodiment

The second embodiment is the same as the first embodiment except that in the former the voltage(s) applied to the ESC electrode(s) 119 is increased as the support portion 122 is lowered. Where the application voltage is negative, it is increased in the negative direction as the support portion 122 is lowered.

FIG. 9 is a conceptual graph in which the horizontal axis represents the time from a start of lowering of the support portion 122 and the vertical axis represents the voltage(s) applied to the ESC electrode(s) 119. A low voltage is applied to the ESC electrode 119 before contact of the holding sheet 3 to the stage 111. And the application voltage is increased as the support portion 122 is lowered and the area of contact between the holding sheet 3 and the stage 111 increases accordingly. As a result, wrinkling of the holding sheet 3 is suppressed even more.

Third Embodiment

The third embodiment is the same as the first embodiment except that in the former voltage application to the ESC electrode(s) 119 is started after contact of the lowest point of the holding sheet 3 to the stage 111 before contact of the outer circumferential portion 3c of holding sheet 3 to the stage 111.

FIG. 10 is a conceptual graph in which the horizontal axis represents the time from a start of lowering of the support portion 122 and the vertical axis represents the voltage(s) applied to the ESC electrode(s) 119. The holding sheet 3 is absorbed on the stage 111 almost at the same time as it comes into contact with the stage 111. As a result, the holding sheet 3 is absorbed to the stage 111 in a state that it is not wrinkled.

Next, fourth and fifth embodiments of the invention will be described. In the fourth and fifth embodiments, the ESC electrodes 119 are plural ring-shaped electrodes which are supplied with voltages that increase in order from the central pair of ring-shaped electrodes outward, whereby the conveyance carrier 10 that holds the substrate 1 is absorbed on the stage 111 in a state that it is not wrinkled.

The frame 2, the holding sheet 3, and the substrate 1 that are used in the fourth and fifth embodiments are the same as used in the first to third embodiments (see FIG. 1), and hence descriptions therefor will be omitted. Plasma processing apparatus according to the fourth and fifth embodiments are basically the same as the plasma processing apparatus 100 according to the first to third embodiments (see FIG. 2) and different from the latter in the structure of the electrostatic chuck mechanism.

(Electrostatic Chuck Mechanism)

In the electrostatic chuck mechanism, a DC power source 126 applies voltages to ring-shaped electrodes 119 disposed inside the stage 111 (electrode layer 115), whereby the conveyance carrier 10 is absorbed on the stage 111 by Coulomb force or Johnsen-Rahbek force that works between the stage 111 and the conveyance carrier 10. The ring-shaped electrodes 119 are disposed so that its center approximately coincides with the center of the stage 111.

Figure 11A:
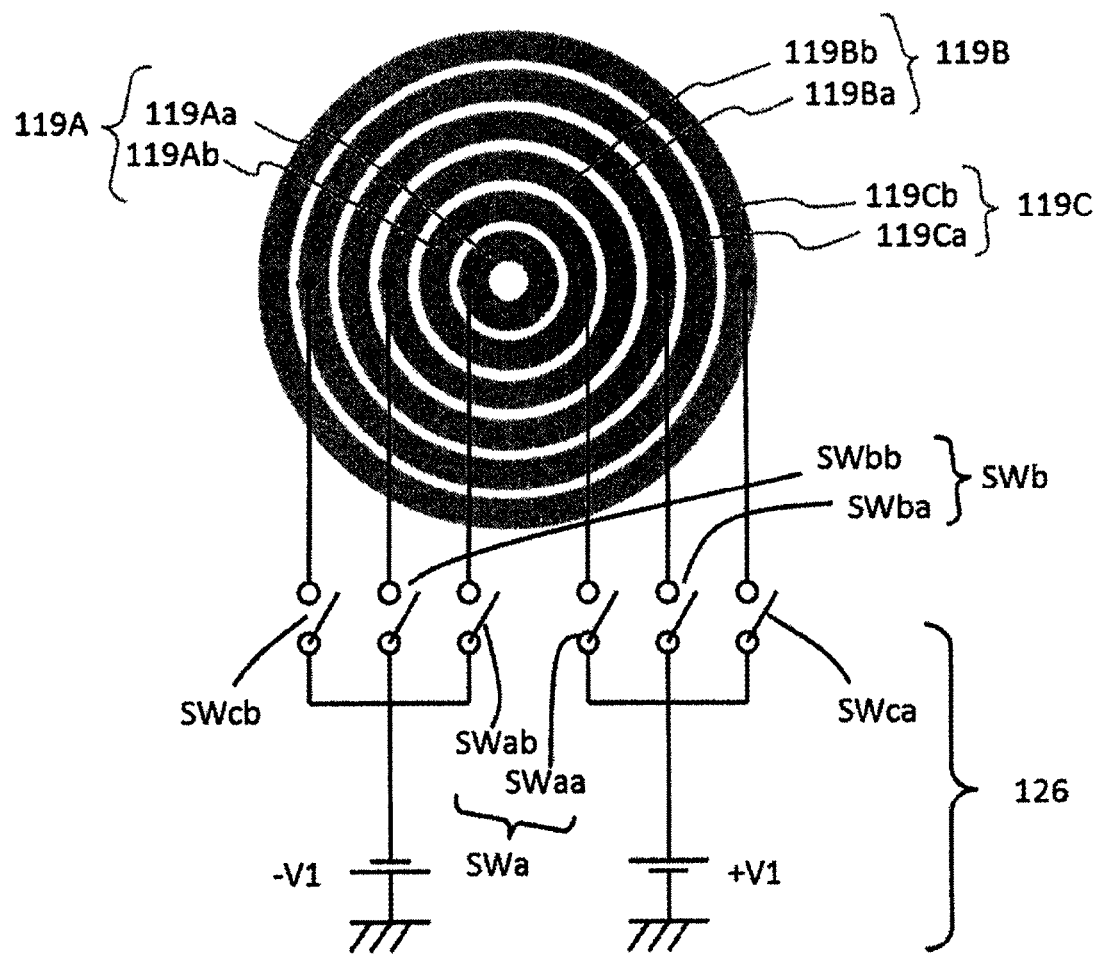
FIG. 11A is a conceptual diagram showing a relationship between ring-shaped electrodes according to fourth and fifth embodiments of the invention and a DC power source.

FIG. 11A conceptually shows a relationship between the ring-shaped electrodes 119 and the DC power source 126. As shown in FIG. 11A, the ring-shaped electrodes 119 include ring-shaped electrodes 119A (119Aa and 119Ab), ring-shaped electrodes 119B (119Ba and 119Bb), and ring-shaped electrodes 119C (119Ca and 119Cb). The ring-shaped electrodes 119 shown in FIG. 11A is of the double-polarity type and hence each pair of adjoining ring-shaped electrodes configure a pair of ring-shaped electrodes 119. A voltage V1 is applied to the positive electrodes and a negative voltage −V1 is applied to the negative electrodes. The number of pairs of ring-shaped electrodes 119 is not limited to three and may be two to six.

Figure 11B:
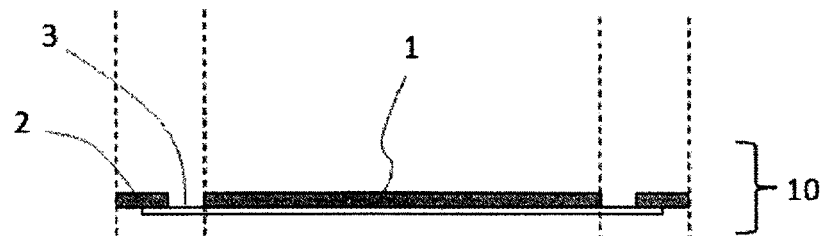
FIGS. 11Ba and 11Bb are conceptual diagrams, in which FIG. 11Ba shows a positional relationship between ring-shaped electrodes and the conveyance carrier as a modification of the ring-shaped electrodes of FIG. 11A and the conveying carrier, and FIG. 11Bb shows a relationship between the ring-shaped electrodes and a DC power source.
Figure 11B:
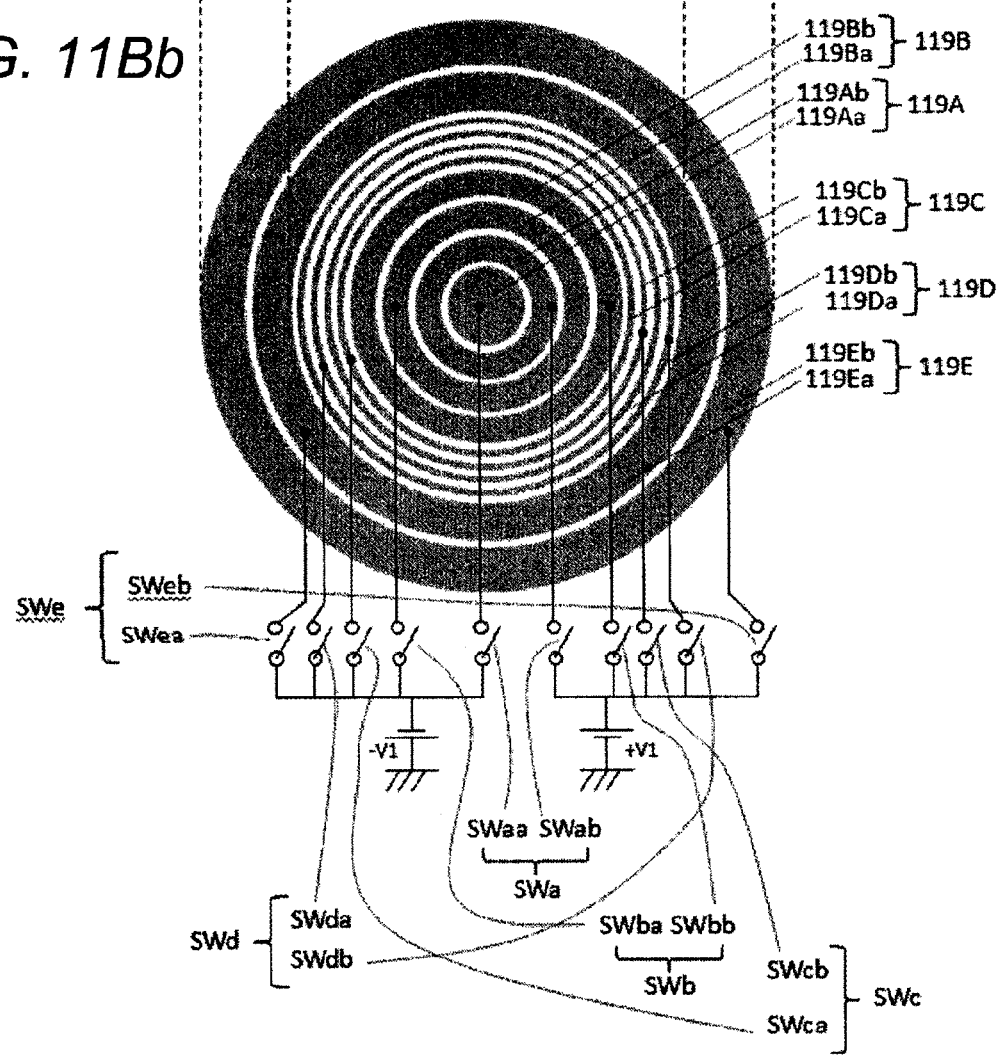

For example, the innermost ring-shaped electrodes 119Aa may be replace by a circular electrode. FIG. 11Bb shows a modified version of the ring-shaped electrodes 119 of FIG. 11A. The ring-shaped electrodes 119 shown in FIG. 11Bb has a circular innermost electrode 119Aa. The circular electrode 119Aa is paired with an adjacent ring-shaped electrode 119Ab to configure double-polarity electrodes 119A. Ring-shaped electrodes 119B (119Ba and 119Bb), ring-shaped electrodes 119C (119Ca and 119Cb), ring-shaped electrodes 119D (119Da and 119Db), and ring-shaped electrodes 119E (119Ea and 119Eb) are formed outside the electrodes 119A.

Since the innermost electrode 119Aa is circular, a wide central portion of the substrate 1 being held by the conveyance carrier 10 mounted on the stage 111 can be absorbed on the stage 111 uniformly (see FIG. 11Ba). This increases the uniformity of plasma processing that is performed on the substrate 1.

Furthermore, in the ring-shaped electrodes 119 shown in FIG. 11Bb, ring-shaped electrodes (e.g., ring-shaped electrodes 119C and 119D) corresponding to a peripheral portion of the substrate 1 are narrow. As a result, the absorption force per unit area acting on the peripheral portion of the substrate 1 is increased, which makes it easier to correct a warp or a bend of the peripheral portion of the substrate 1.

FIG. 11Cb shows a modified version of the ring-shaped electrodes 119 of FIG. 11Bb. In the ring-shaped electrodes 119 shown in FIG. 11Cb, the ring-shaped electrodes 119D and ring-shaped electrodes 119E shown in FIG. 11Bb are replaced by outermost comb electrodes 119D. The comb electrodes 119D include a positive electrode 119Db and a negative electrode 119Da, which are disposed in such a manner that their teeth are arranged alternately. The positive electrode 119Db and the negative electrode 119Da, which are adjacent to each other, are paired to configure double-polarity comb electrodes 119D.

The operation mode of the ring-shaped electrodes 119 may be either the double-polarity mode or the single-polarity mode. Where the ring-shaped electrodes 119 operate in the single-polarity mode, the conveyance carrier 10 is absorbed on the stage 111 by activating the DC power source 126 and the first radio-frequency power source 110A. More specifically, absorption force is generated between the conveyance carrier 10 and the stage 111 by charging the surface of the conveyance carrier 10 by activating the first radio-frequency power source 110A and thereby generating plasma in the vacuum chamber 103 and applying voltages of the same polarity to all the ring-shaped electrodes 119 by activating the DC power source 126.

Where the ring-shaped electrodes 119 operate in the double-polarity mode, the conveyance carrier 10 is absorbed on the stage 111 by activating the DC power source 126. More specifically, absorption force is generated between the conveyance carrier 10 and the stage 111 by applying voltages of the opposite polarities to the positive electrodes and the negative electrodes of the ring-shaped electrodes 119 by activating the DC power source 126. The following description will be directed to the case that the ring-shaped electrodes 119 have the structure of FIG. 11A and operate in the double-polarity mode. However, the invention is not limited to such a case.

As shown in FIG. 11A, the double-polarity ring-shaped electrodes 119A, ring-shaped electrodes 119B, and ring-shaped electrodes 119C are connected to the DC power source 126 independently of each other. Therefore, the timing of applying voltages to the ring-shaped electrodes 119A, the ring-shaped electrodes 119B, and the ring-shaped electrodes 119C can be controlled using switches SWa (SWaa and SWab), switches SWb (SWba and SWbb), and switches SWc (SWca and SWcb), respectively. Each of the pairs of switches SWaa and SWab, switches SWba and SWbb, and switches SWca and SWcb is turned on or off simultaneously.

Although in FIG. 11A the ring-shaped electrodes 119A, the ring-shaped electrodes 119B, and the ring-shaped electrodes 119C are connected, via the switches SWa, SWb, and SWc, to the DC power source 126 which a positive power source and a negative power source, the invention is not limited to such a case. For example, voltages applied to the ring-shaped electrodes 119A, voltages applied to the ring-shaped electrodes 119B, and voltages applied to the ring-shaped electrodes 119C may be controlled independently using plural DC power sources 126. This makes it possible to control the voltage application to the electrodes without the need for turning on/off switches and also to apply different voltages to these pairs of electrodes.

The control device 128 controls the voltage application to the ring-shaped electrodes 119 according to the operation of the support portion 122. More specifically, in mounting the conveyance carrier 10 on the stage 111, the electrostatic chuck mechanism apply voltages in order from the central side of the plurality of ring-shaped electrodes 119 (ring-shaped electrode 119A) to the outer circumference side (ring-shaped electrodes 119C).

In the ring-shaped electrode 119, voltages are to be applied to electrodes at the central side earlier than electrodes at the outer circumference. That is, it is not always necessary to apply voltages first to only the innermost ring-shaped electrodes 119A and to apply voltages last to only the outermost ring-shaped electrodes 119C. Voltages may be applied simultaneously to adjoining pairs of ring-shaped electrodes.

There are no limitations on the timing of a start of voltage application to the ring-shaped electrodes 119; voltage application may be started either after or before contact of the outer circumferential portion 3c of the holding sheet 3 to the stage 111.

The fourth and fifth embodiments will be described below in detail for the case that voltage application is started before contact of the outer circumferential portion 3c of the holding sheet 3 to the stage 111 and the case that voltage application is started after contact of the outer circumferential portion 3c of the holding sheet 3 to the stage 111, respectively. However, the invention is not limited to these embodiments and various modifications are possible.

Fourth Embodiment

In the fourth embodiment, voltage application is started after contact of the outer circumferential portion 3c of the holding sheet 3 to the stage 111. FIG. 12A to 12C are conceptual graphs in which the horizontal axes represent the time from a start of lowering of the support portion 122 and the vertical axes represent the voltages applied to the respective pairs of ring-shaped electrodes 119. A time point when the control device 128 causes the support portion 122 that supports the conveyance carrier 10 to start to be lowered is indicated in FIG. 12A to 12C. The term "start of landing" means a time point when the lowest point of a warped portion (hereinafter, referred to as warped portion) of the holding sheet 3 of the conveyance carrier 10 just comes into contact with the stage 111. The term "completion of landing" means a time point when the top surface 122a of the support portion 122 has been lowered to the same or lower level as or than the surface of the stage 111 and (at least a part of) the outer circumferential portion 3c of the holding sheet 3 just comes into contact the stage 111.

Whether or not the lowest point of the warped portion of the holding sheet 3 has touched the stage 111 is determined on the basis of, for example, a distance D of lowering of the top surface 122a of the support portion 122. A warp Tc (described later) of the holding sheet 3 that is held by the conveyance carrier 10 is measured, and a lowering distance D of the support portion 122 that occurs when the distance T between the top surface 122a of the support portion 122 and the surface of the stage 111 becomes equal to Tc is recognized in advance. A time point when the lowering distance of the support portion 122 has become equal to D is regarded as a time point when the lowest point of the warped portion of the holding sheet 3 being held by the conveyance carrier 10 has just touched the stage 111.

For example, a warp Tc is determined in the following manner. As shown in FIG. 5, the conveyance carrier 10 is placed on the top surface 122a of the support portion 122 that is located at such a height that the holding sheet 3 is not in contact with the stage 111. In this state, in a cross section taken so as to pass the center of the conveyance carrier 10, the warp Tc is determined as a distance between a straight line L1 that passes the bottom surface 3b of the outer circumferential portion 3c of the holding sheet 3 and a tangential line L2 to the bottom surface (3b) of a warped portion of the holding sheet 3 at its lowest point.

It is not always necessary to measure a warp Tc in the reaction chamber 103 or the plasma processing apparatus 100. For example, a warp Tc may be measured by, for example, a noncontact optical measuring instrument before processing by the plasma processing apparatus 100. To facilitate understanding, the warp Tc is exaggerated in FIG. 5. For example, a warp Tc of about 50 to 800 μm occurs in the case where the diameter of the frame 2 is about 300 mm, the diameter and the thickness of the substrate 1 are about 150 mm and about 100 μm, respectively, and the thickness of the holding sheet 3 is about 110 μm.

The substrate 1 is held by the holding sheet 3 in such a manner that the center of the substrate 1 approximately coincides with that of the frame 2. The conveyance carrier 10 is mounted on the stage 111 in such a manner that the center of the holding sheet 3 approximately coincides with that of the center of the ring-shaped electrodes 119. Therefore, when the conveyance carrier 10 is mounted on the stage 111, a warped portion of the holding sheet 3 approximately coincides with the center of the ring-shaped electrodes 119. When voltages are applied to the ring-shaped electrodes 119 in order from the central pair of ring-shaped electrodes 119A outward, the holding sheet 3 starts to be absorbed on the stage starting from its warped portion. The portion, absorbed on the stage 111, of the holding sheet 3 expands in a concentric manner from its center. During that course, wrinkles that developed when the conveyance carrier 10 is mounted on the stage 111 are removed gradually. As a result, the substrate 1 is etched uniformly in plasma processing that is performed subsequently. This leads to increase in production yield.

How the plasma processing apparatus 100 operates will be described below in a specific manner with reference to FIGS. 13A to 13E. Also in FIGS. 13A to 13E, warps are exaggerated to facilitate understanding of the description.

In the vacuum chamber 103, as shown in FIG. 13A, the support portion 122 stands by at the elevated position for support of the conveyance carrier 10 and the cover 124 also stands by at the elevated position. As shown in FIG. 13B, the conveyance carrier 10 is carried into the vacuum chamber 103 by the conveying mechanism (not shown) and transferred to the support portion 122.

The conveyance carrier 10 is placed on the top surface 122a of the support portion 122 in such a manner that the surface (adherent surface 3a), holding the substrate 1, of the holding sheet 3 is located up. The frame 2 may be placed on the top surface 122a of the support portion 122 either via the outer circumferential portion 3c of the holding sheet 3 or directly. From the viewpoint of preventing the holding sheet 3 from peeling off the frame 2 when the support portion 122 is elevated or lowered, it is preferable that the conveyance carrier 10 be placed on the top surface 122a of the support portion 122 via the outer circumferential portion 3c of the holding sheet 3.

Then, as shown in FIG. 13C, the support portion 122 is lowered, whereby the conveyance carrier 10 is mounted on the stage 111. The state that the conveyance carrier 10 is mounted on the stage 111 means a state that the outer circumferential portion 3c of the holding sheet 3 is in contact with the stage 111. If the top surface 122a of the support portion 122 has been lowered to the same or lower level as or than the surface of the stage 111, it can be determined that the outer circumferential portion 3c of the holding sheet 3 is in contact with the stage 111.

Upon a determination that the outer circumferential portion 3c of the holding sheet 3 is in contact with the stage 111, as shown in FIG. 13D the control device 128 starts applying voltages to the ring-shaped electrodes 119 from the DC power source 126 in order from the central side of the central ring-shaped electrodes 119 (ring-shaped electrode 119A) to the outer circumference side. As a result, the conveyance carrier 10 that holds the substrate 1 can be absorbed on the stage 111 in a state that the conveyance carrier 10 is not wrinkled.

Subsequently, as shown in FIG. 13E, the elevation rods 121 are driven by the elevation mechanism 123B and thereby lower the cover 124 to a prescribed position (see FIG. 13E). When the cover 124 has been set at the prescribed lowered position, the frame 2 and the portion of the holding sheet 3 that is not holding the substrate 1 are covered with the cover 124 without being in contact with it and the substrate 1 is exposed through the window 124W of the cover 124.

When the support portion 122 and the cover 124 have been set at the prescribed positions, process gas is introduced into the vacuum chamber 103 from the process gas source 112 via the gas inlet 103a. On the other hand, the pressure reducing mechanism 114 exhausts gas from the vacuum chamber 103 via the exhaust outlet 103b to maintain a prescribed pressure in the vacuum chamber 103.

Then plasma P is generated in the vacuum chamber 103 by inputting radio-frequency power to the antenna 109 from the first radio-frequency power source 110A. The generated plasma P is composed of ions, electrons, radicals, etc. Plasma processing on the substrate 1 is started by inputting radio-frequency power to the radio-frequency electrode 120 from the second radio-frequency power source 110B. The energy of incidence of ions on the substrate 1 can be controlled by the bias voltage that is applied from the second radio-frequency power source 110B to the radio-frequency electrode 120. The portions, exposed from the resist mask formed on the substrate 1, of the substrate 1 are removed from their top surfaces to bottom surfaces by a physico-chemical reaction to the generated plasma P, whereby the substrate 1 is divided into individual pieces. The steps from the fragmentation to carrying-out of the conveyance carrier 10 may be the same as in the first embodiment.

This embodiment is particularly useful when applied to a case that the frame 2 has no or a relatively low degree of distortion. The above-described first to fourth cases are conceivable as causes of a warp of the holding sheet 3. Where the frame 2 has only a low degree of distortion, the conveyance carrier 10 can be mounted on the stage 111 so as to be almost flat. Therefore, even if the holding sheet 3 is wrinkled due to the cause of the second, third, or fourth case when it is mounted on the stage 111, the holding sheet 3 can be absorbed on the stage 111 while being unwrinkled by applying voltages to the ring-shaped electrodes 119 in order from the central side to the outer circumference.

Fifth Embodiment

The fifth embodiment is the same as the fourth embodiment except that in the former voltage application is started before contact of the outer circumferential portion 3c of the holding sheet 3 to the stage 111.

This embodiment is particularly useful when applied to a case that the frame 2 is distorted. Where the frame 2 has no distortion, the conveyance carrier 10 can be mounted on the stage 111 so as to be almost flat. On the other hand, if the frame 2 is distorted, the substrate 1 and the holding sheet 3 which are thin and light are elevated from the stage 111 due to the distortion of the frame 2 to form a gap between the stage 111 and themselves. Or the substrate 1 and the holding sheet 3 are wrinkled due to the distortion of the frame 2.

In the embodiment, application of voltages to the ring-shaped electrodes 119 is started before contact of the outer circumferential portion 3c of the holding sheet 3 to the stage 111, whereby the substrate 1 and the holding sheet 3 are absorbed on the stage 111. Since the substrate 1 and the holding sheet 3 are absorbed on the stage 111 before the frame 2 is mounted on the stage 111, elevation of the substrate 1 and the holding sheet 3 can be suppressed even if the frame 2 is distorted. As a result, formation of a gap between the stage 111 and themselves and wrinkling of them can be suppressed.

Figure 14A:
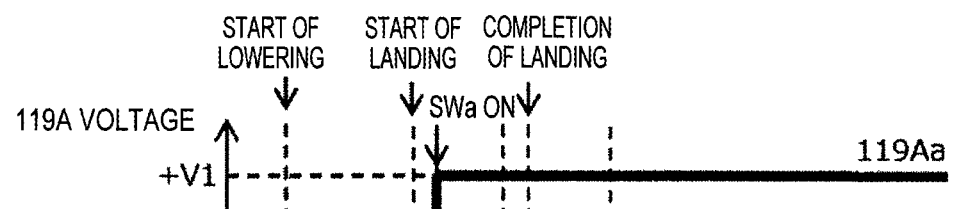
FIG. 14Aa to 14Ac are conceptual graphs showing an operation of a plasma processing apparatus according to the fifth embodiment in which the horizontal axes represent the time from a start of lowering of the support portion and the vertical axes represent the voltages applied to the respective pairs of ring-shaped electrodes (pattern A).
Figure 14A:
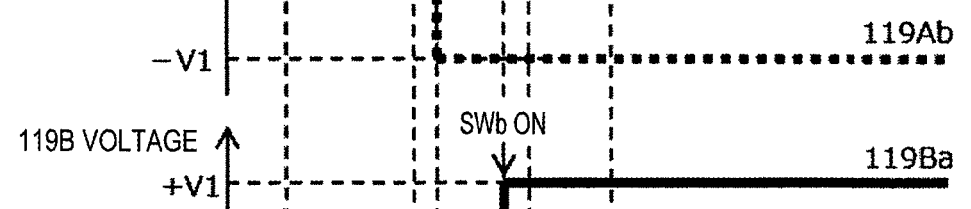
Figure 14A:

FIGS. 14Aa to 14Ac and FIGS. 14Ba to 14Bc are conceptual graphs in each of which the horizontal axes represent the time from a start of lowering of the support portion 122 and the vertical axes represent the voltages applied to the respective pairs of ring-shaped electrodes 119. FIGS. 14Aa to 14Ac show a pattern A in which voltage application to the central ring-shaped electrodes 119A is started after contact of the lowest point of a warped portion of the holding sheet 3 to the stage 111 (i.e., a start of landing) before contact of the outer circumferential portion 3c of the holding sheet 3 to the stage 111 (i.e., completion of landing). FIGS. 14Ba to 14Bc show a pattern B in which voltage application to the central ring-shaped electrodes 119A is started after a start of lowering of the support portion 122 (i.e., a start of lowering) before contact of the lowest point of a warped portion of the holding sheet 3 to the stage 111 (i.e., a start of landing).

FIGS. 15A to 15D conceptually show an operation from a start of lowering, by the control device 128, of the support portion 122 that supports the conveyance carrier 10 to mounting of the conveyance carrier 10 on the stage 111. To facilitate understanding, a ring-shaped electrode pair(s) 119 to which voltages are applied is hatched in FIGS. 15A to 15D. Also in FIGS. 15A to 15D, warps are exaggerated for the sake of description.

Figure 15A:
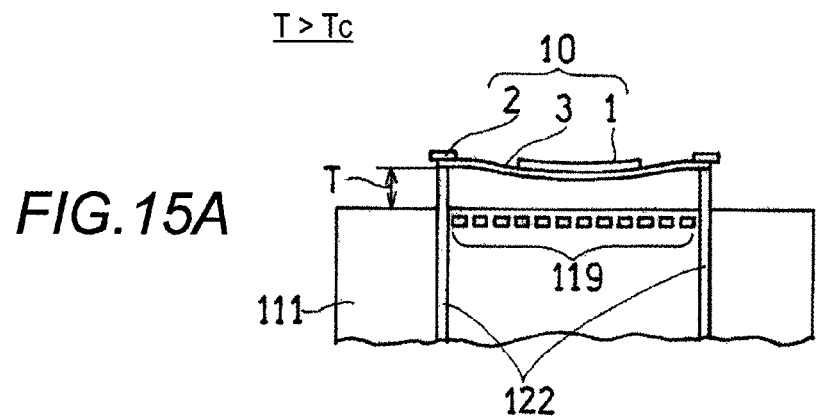
FIGS. 15A to 15D are conceptual diagrams showing an operation of the plasma processing apparatus according to the fifth embodiment from a start of lowering of the support portion to mounting of the conveyance carrier on the stage.
Figure 15B:
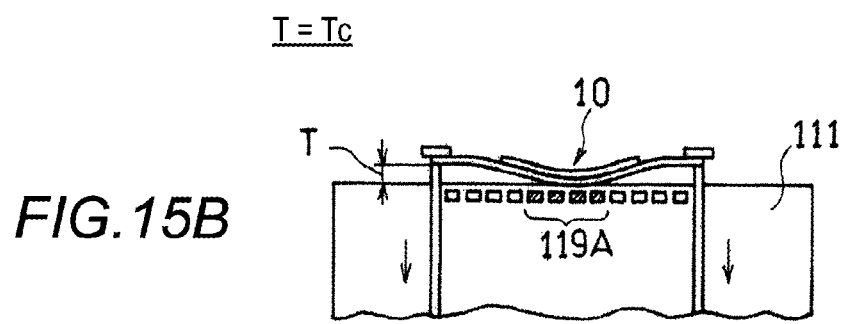
Figure 15C:
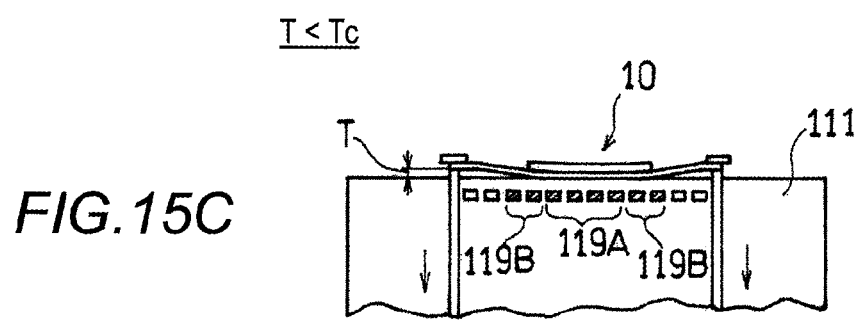
Figure 15D:
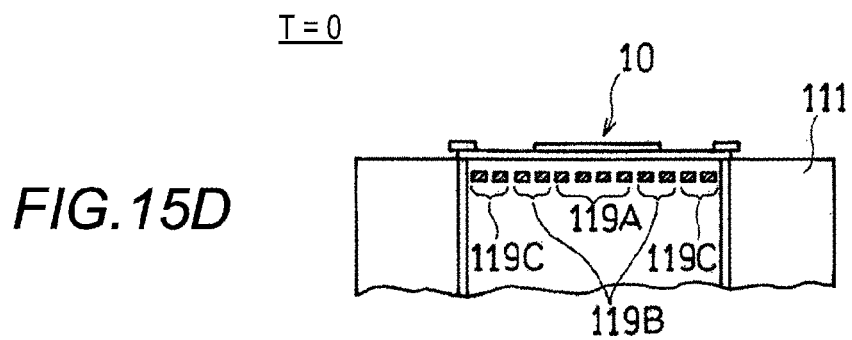

In the case of the pattern A (FIGS. 14Aa to 14Ac), first, the support portion 122 that supports the conveyance carrier 10 starts to be lowered as shown in FIG. 15A. At this time, the distance T between the top surface 122a of the support portion 122 and the stage 111 is longer than the warp Tc (T>Tc). When the support portion 122 has been lowered further and it is determined that the lowest point of a warped portion of the holding sheet 3 has come into contact with the stage 111 (T=Tc), as shown in FIG. 15B the switches SWa are turned on and voltages are applied to the ring-shaped electrodes 119A. The support portion 122 is lowered further, and as shown in FIG. 15C the switches SWb are turned on before contact of the outer circumferential portion 3c of the holding sheet 3 to the stage 111 (T<Tc), whereby voltages are applied to the ring-shaped electrodes 119B. When it is determined that the outer circumferential portion 3c of the holding sheet 3 has come into contact with the stage 111 (T=0), as shown in FIG. 15D the switches SWc are turned on and voltages are applied to the ring-shaped electrodes 119C.

That is, in the pattern A, after the lowest point of a warped portion of the holding sheet 3 is first absorbed on the stage 111, voltages are applied to the ring-shaped electrodes 119B and the ring-shaped electrodes 119C in order, whereby the holding sheet 3 is absorbed on the stage 111 gradually from the center outward so as to follow the portion of the holding sheet 3 that newly comes into contact with the stage 111. As a result, the holding sheet 3 is absorbed on the stage 111 in a state that it is not wrinkled.

In the case of the pattern B (FIGS. 14Ba to 14Bc), voltage application to the central ring-shaped electrodes 119A is started after a start of lowering of the support portion 122 before contact of the lowest point of a warped portion of the holding sheet 3 to the stage 111. Therefore, the lowest point of the warped portion of the holding sheet 3 is absorbed on the stage 111 as soon as it comes into contact with the stage 111. From this time onward, the contact portion and the absorption portion of the holding sheet 3 to and on the stage 111 expand so as to form concentric circles having the common center. As a result, the holding sheet 3 is absorbed on the stage 111 in a state that it is not wrinkled.

Although in the patterns A and B the voltage application to all the ring-shaped electrodes 119 is completed after completion of landing of the conveyance carrier 10, the invention is not limited to such a case. For example, the voltage application to all the ring-shaped electrodes 119 may be completed before completion of landing of the conveyance carrier 10.

The above-description has been directed to the case that the ring-shaped electrodes 119 operate in the double-polarity mode at a start of absorption of the conveyance carrier 10 on the stage 111. However, the ring-shaped electrodes 119 may operate in the single-polarity mode at this time point. This can be realized by changing the timing of plasma generation.

More specifically, the support portion 122 is lowered after placement of the conveyance carrier 10 on the top surface 122a of the support portion 122 and exit of the conveying mechanism from the vacuum chamber 103. And plasma is generated in the vacuum chamber 103 by inputting low power (e.g., 500 W or less) to the antenna 109 from the first radio-frequency power source 110A before contact of the lowest point of a warped portion of the holding sheet 3 to the stage 111. As a result, the conveyance carrier 10 is charged, whereby absorption force is generated between the conveyance carrier 10 and the stage 111 upon application of a voltage to the ring-shaped electrodes 119A.

The plasma processing apparatus according to one or more embodiments of the invention is useful as an apparatus for performing plasma processing on a substrate that is held by a conveyance carrier.

What is claimed is:

1. A plasma processing method for performing plasma processing on a substrate that is held by a conveyance carrier that is mounted on a stage of the plasma processing apparatus, the conveyance carrier comprising a holding sheet that holds the substrate and a frame that is attached to an outer circumferential portion of the holding sheet, said plasma processing method comprising:

causing a support portion, which is capable of being elevated and lowered relative to the stage, to support the conveyance carrier at a transfer position that is distant from the stage upward;

mounting the conveyance carrier to a stage-mounted position on the stage by lowering the support portion; and applying a voltage to an electrode portion, disposed inside the stage, of an electrostatic chuck mechanism before contact of the outer circumferential portion of the holding sheet to the stage.

2. The plasma processing method according to claim 1, wherein application of the voltage to the electrode portion is started before contact of the holding sheet to the stage.

3. The plasma processing method according to claim 1, wherein application of the voltage to the electrode portion is started after contact of the holding sheet to the stage and before contact of the outer circumferential portion of the holding sheet to the stage.

4. The plasma processing method according to claim 1, wherein an absolute value of the voltage applied to the electrode portion is increased as the support portion is lowered.

5. A plasma processing method for performing plasma processing on a substrate that is held by a conveyance carrier that is mounted on a stage of the plasma processing apparatus, the conveyance carrier comprising a holding sheet that holds the substrate and a frame that is attached to an outer circumferential portion of the holding sheet, said plasma processing method comprising:

causing a support portion, which is capable of being elevated and lowered relative to the stage, to support the conveyance carrier at a transfer position that is distant from the stage upward;

mounting the conveyance carrier to a stage-mounted position on the stage by lowering the support portion; and applying voltages to an electrode portion, disposed inside the stage, of an electrostatic chuck mechanism, wherein the electrode portion comprises a plurality of ring-shaped electrodes arranged concentrically, and wherein voltages are applied to the plural ring-shaped electrodes in order from a central side of the ring-shaped electrode toward an outer circumference side, and wherein the voltage is applied to the central ring-shaped electrode before contact of the outer circumferential portion of the holding sheet to the stage.

* * * * *